US012416655B2

(12) United States Patent
Ohta

(10) Patent No.: US 12,416,655 B2
(45) Date of Patent: Sep. 16, 2025

(54) COMPUTER-READABLE RECORDING MEDIUM STORING SIMULATION PROGRAM, SIMULATION METHOD, AND SIMULATION DEVICE

(71) Applicant: Fujitsu Limited, Kawasaki (JP)

(72) Inventor: Eiji Ohta, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 362 days.

(21) Appl. No.: 18/151,596

(22) Filed: Jan. 9, 2023

(65) Prior Publication Data

US 2023/0324443 A1    Oct. 12, 2023

(30) Foreign Application Priority Data

Apr. 12, 2022   (JP) .................. 2022-065918

(51) Int. Cl.
  *G01R 29/08*    (2006.01)
  *G06F 30/20*    (2020.01)
(52) U.S. Cl.
  CPC ............. *G01R 29/08* (2013.01); *G06F 30/20* (2020.01)

(58) Field of Classification Search
  CPC .............................. G06F 30/20; G01R 29/08
  See application file for complete search history.

(56) References Cited

U.S. PATENT DOCUMENTS

| | | | |
|---|---|---|---|
| 7,088,088 B1 * | 8/2006 | Marzalek | G01R 31/2822 324/76.19 |
| 2010/0088566 A1 | 4/2010 | Nagase et al. | |
| 2010/0312539 A1 * | 12/2010 | Yamagajo | G06F 30/23 703/14 |

FOREIGN PATENT DOCUMENTS

| | | | | |
|---|---|---|---|---|
| CN | 106295120 B | * | 10/2019 | ............. G16Z 99/00 |
| JP | 2010-092190 A | | 4/2010 | |
| JP | 2010-282516 A | | 12/2010 | |

* cited by examiner

*Primary Examiner* — Lee E Rodak
*Assistant Examiner* — Taqi R Nasir
(74) *Attorney, Agent, or Firm* — Fujitsu Intellectual Property Center

(57) ABSTRACT

A non-transitory computer-readable recording medium stores a simulation program for causing a computer to execute a process including: generating thinned grids for electromagnetic current computation, according to electric field strength distribution in an equivalent electromagnetic current area; and calculating equivalent electromagnetic currents and far fields, by using the thinned grids.

17 Claims, 23 Drawing Sheets

FIG. 4
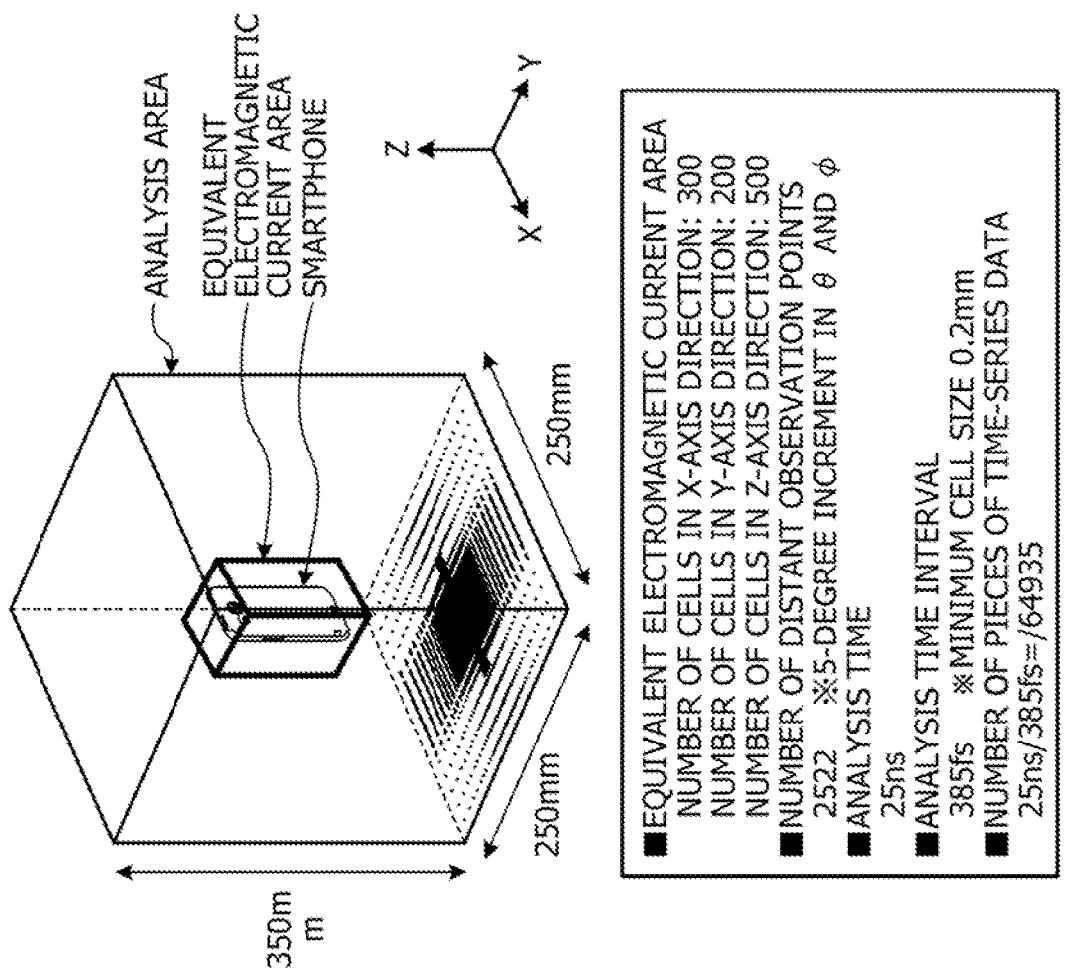
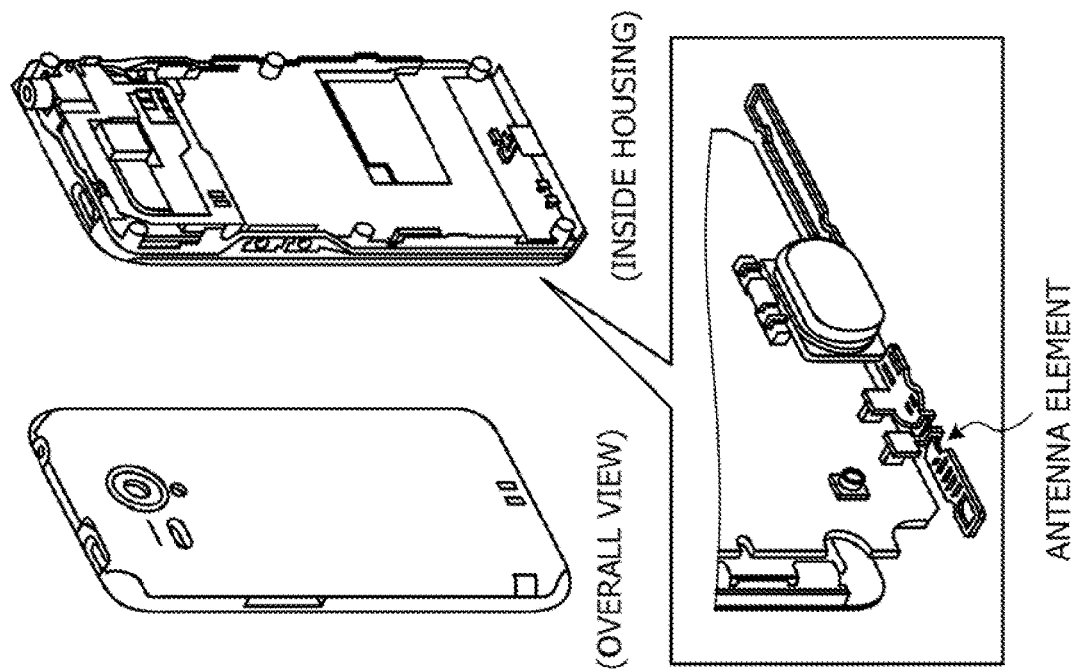

FIG. 7

| X-AXIS NUMBER OF GRIDS n | Y-AXIS NUMBER OF GRIDS m | NUMBER OF MERGED CELLS p |  | 33 |
|---|---|---|---|---|
| X-AXIS GRID INTERVAL_1 | X-AXIS GRID INTERVAL_2 | ... | X-AXIS GRID INTERVAL_n-1 | |
| Y-AXIS GRID INTERVAL_1 | Y-AXIS GRID INTERVAL_2 | ... | Y-AXIS GRID INTERVAL_m-1 | |
| MERGED CELL_1_X-AXIS MINIMUM GRID NUMBER | MERGED CELL_1_Y-AXIS MINIMUM GRID NUMBER | MERGED CELL_1_X-AXIS MAXIMUM GRID NUMBER | MERGED CELL_1_Y-AXIS MAXIMUM GRID NUMBER | |
| MERGED CELL_2_X-AXIS MINIMUM GRID NUMBER | MERGED CELL_2_Y-AXIS MINIMUM GRID NUMBER | MERGED CELL_2_X-AXIS MAXIMUM GRID NUMBER | MERGED CELL_2_Y-AXIS MAXIMUM GRID NUMBER | |
| ... | ... | ... | ... | |
| MERGED CELL_p_X-AXIS MINIMUM GRID NUMBER | MERGED CELL_p_Y-AXIS MINIMUM GRID NUMBER | MERGED CELL_p_X-AXIS MAXIMUM GRID NUMBER | MERGED CELL_p_Y-AXIS MAXIMUM GRID NUMBER | |

FIG. 14

FIG. 15

■ THINNED GRID GENERATION NOT PERMITTED FOR EIGHTH THINNING TARGET RANGE

| | | | | | -11 | -10 | -30 | -30 |
|---|---|---|---|---|---|---|---|---|
| | | | | -10 | -10 | -20 | -25 | |
| | | | -10 | -7 | -8 | -20 | | |
| | | -20 | -5 | -7 | -20 | | | |
| | -20 | 0 | -5 | -20 | | | | |
| | -20 | -20 | -20 | -30 | | | | |
| | | | -22 | -22 | | | | |
| | | -25 | -25 | | | | | |
| | -30 | -30 | | | | | | |
| -40 | -40 | | | | | | | |

↑ GENERATION NOT PERMITTED

⇨

■ THINNED GRID GENERATION NOT PERMITTED FOR NINTH THINNING TARGET RANGE

| | | | | | -11 | -10 | -30 | -30 |
|---|---|---|---|---|---|---|---|---|
| | | | | -10 | -10 | -20 | -25 | |
| | | | -10 | -7 | -8 | -20 | | |
| | | -20 | -5 | -7 | -20 | | | |
| | -20 | 0 | -5 | -20 | | | | |
| | -20 | -20 | -20 | -30 | | | | |
| | | | -22 | -22 | | | | |
| | | -25 | -25 | | | | | |
| | -30 | -30 | | | | | | |
| -40 | -40 | | | | | | | |

↑ GENERATION NOT PERMITTED

⇨

FIG. 16

FIG. 18

■THINNED GRID (WHEN THINNED GRID GENERATION PROCESS IS COMPLETED)

FIG. 19

■ EXAMPLE) ELECTRIC CURRENT COMPUTATION CORRESPONDING TO THINNED GRID

| | | | $J_{08}$ | | $J_{28}$ | | $J_{48}$ | |
|---|---|---|---|---|---|---|---|---|
| | | | | | | $J_{27}$ | $J_{37}$ | $J_{47}$ | $J_{57}$ |
| | | | $J_{05}$ | | | $J_{26}$ | $J_{36}$ | $J_{46}$ | $J_{56}$ |
| | | | $J_{04}$ | | | $J_{25}$ | $J_{35}$ | $J_{45}$ | $J_{55}$ |
| | | | | | | $J_{24}$ | $J_{34}$ | $J_{44}$ | $J_{54}$ |
| | | | $J_{02}$ | | $J_{22}$ | | $J_{42}$ | |
| | | | $J_{00}$ | | $J_{20}$ | | $J_{40}$ | |

ELECTRIC CURRENT IS COMPUTED FOR EACH CELL OF THINNED GRID

■ EXAMPLE) MAGNETIC FIELD COMPUTATION RESULTS CORRESPONDING TO THINNED GRID

| $H_{00}$ | $H_{01}$ | $H_{02}$ | $H_{03}$ | $H_{04}$ | $H_{05}$ | $H_{06}$ | $H_{07}$ | $H_{08}$ | $H_{09}$ |
| $H_{10}$ | $H_{11}$ | $H_{12}$ | $H_{13}$ | $H_{14}$ | $H_{15}$ | $H_{16}$ | $H_{17}$ | $H_{18}$ | $H_{19}$ |
| $H_{20}$ | $H_{21}$ | $H_{22}$ | $H_{23}$ | $H_{24}$ | $H_{25}$ | $H_{26}$ | $H_{27}$ | $H_{28}$ | $H_{29}$ |
| $H_{30}$ | $H_{31}$ | $H_{32}$ | $H_{33}$ | $H_{34}$ | $H_{35}$ | $H_{36}$ | $H_{37}$ | $H_{38}$ | $H_{39}$ |
| $H_{40}$ | $H_{41}$ | $H_{42}$ | $H_{43}$ | $H_{44}$ | $H_{45}$ | $H_{46}$ | $H_{47}$ | $H_{48}$ | $H_{49}$ |
| $H_{50}$ | $H_{51}$ | $H_{52}$ | $H_{53}$ | $H_{54}$ | $H_{55}$ | $H_{56}$ | $H_{57}$ | $H_{58}$ | $H_{59}$ |

MAGNETIC FIELD COMPUTATION RESULTS CORRESPONDING TO ELECTRIC CURRENT $J_{48}$:
$H_{48}, H_{49}, H_{58}, H_{59}$

FIG. 22

■ MEMORY CAPACITY

| COMPUTATION APPROACH | NUMBER OF DISTANT OBSERVATION POINTS | NUMBER OF PIECES OF TIME-SERIES DATA | TOTAL NUMBER OF EQUIVALENT ELECTROMAGNETIC CURRENT AREA CELLS | MEMORY CAPACITY |
|---|---|---|---|---|
| PRIOR TECHNIQUE | 720 | 530 | 39936 | 172.4MB |
| PROPOSED TECHNIQUE | 720 | 530 | 19552 | 86.0MB(-50%) |

■ AMOUNT OF COMPUTATION

| COMPUTATION APPROACH | NUMBER OF DISTANT OBSERVATION POINTS | NUMBER OF PIECES OF TIME-SERIES DATA | TOTAL NUMBER OF EQUIVALENT ELECTROMAGNETIC CURRENT AREA CELLS | MEMORY CAPACITY |
|---|---|---|---|---|
| PRIOR TECHNIQUE | 720 | 530 | 39936 | 152.4GFlop |
| PROPOSED TECHNIQUE | 720 | 530 | 19552 | 74.6GFlop(-51%) |

■ COMPUTATIONAL TIME

| COMPUTATION APPROACH | COMPUTATIONAL TIME |
|---|---|
| PRIOR TECHNIQUE | 475s |
| PROPOSED TECHNIQUE | 289s(-40%) |

※OBSERVATION ENVIRONMENT
PC/AT COMPATIBLE MACHINE
CPU: Intel Core i7-3770K CPU 3.5GHz × 1

CONFIRMED THAT TEST MODEL (SMALL-SCALE) HAS EFFECTS OF REDUCING MEMORY CAPACITY BY 50% AND REDUCING COMPUTATION TIME BY 40%
FURTHER EFFECTS MAY BE EXPECTED WITH LARGER-SCALE MODEL

COMPUTER-READABLE RECORDING MEDIUM STORING SIMULATION PROGRAM, SIMULATION METHOD, AND SIMULATION DEVICE

CROSS-REFERENCE TO RELATED APPLICATION

This application is based upon and claims the benefit of priority of the prior Japanese Patent Application No. 2022-65918, filed on Apr. 12, 2022, the entire contents of which are incorporated herein by reference.

FIELD

The embodiments discussed herein are related to a simulation program, a simulation method, and a simulation device.

BACKGROUND

There is a method for quickly calculating a far-field electromagnetic field from a near-field electromagnetic field calculated by numerical computation or the like, using the equivalence theorem with less computational resources. Note that the far-field electromagnetic field will be sometimes expressed simply as a far field.

Japanese Laid-open Patent Publication No. 2010-282516 and Japanese Laid-open Patent Publication No. 2010-092190 are disclosed as related art.

SUMMARY

According to an aspect of the embodiments, a non-transitory computer-readable recording medium stores a simulation program for causing a computer to execute a process including: generating thinned grids for electromagnetic current computation, according to electric field strength distribution in an equivalent electromagnetic current area; and calculating equivalent electromagnetic currents and far fields, by using the thinned grids.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a diagram for explaining the computation of the far field in a smartphone;

FIG. 7 is a diagram illustrating an example of thinned grid data 33 according to the first embodiment;

FIG. 14 is a diagram illustrating an example of the thinned grid process (2) according to the first embodiment;

FIG. 15 is a diagram illustrating an example of the thinned grid process (3) according to the first embodiment;

FIG. 16 is a diagram illustrating an example of the thinned grid process (4) according to the first embodiment;

FIG. 18 is a diagram illustrating an example of cells when the thinned grid generation process according to the first embodiment is completed;

FIG. 19 is a diagram illustrating an example of an equivalent electromagnetic current calculation process according to the first embodiment;

FIG. 22 is a diagram illustrating an example of effects according to the first embodiment.

DESCRIPTION OF EMBODIMENTS

However, with the recent improvement in the performance and density of electronic devices, the shape of analysis target models in far-field electromagnetic field simulations has become more complicated, and the scale-up of analysis models has been promoted. Therefore, the memory capacity and computational time involved in the computation of the far field are increasing.

An object of one aspect is to provide a simulation program, a simulation method, and a simulation device capable of reducing the memory capacity and computational time involved in the computation of the far field.

Embodiments of a simulation program, a simulation method, and a simulation device according to the present embodiments will be described in detail below with reference to the drawings. Note that the present embodiments are not limited by the following embodiments. In addition, the embodiments may be appropriately combined with each other unless otherwise contradicted.

First Embodiment

Figure 1:
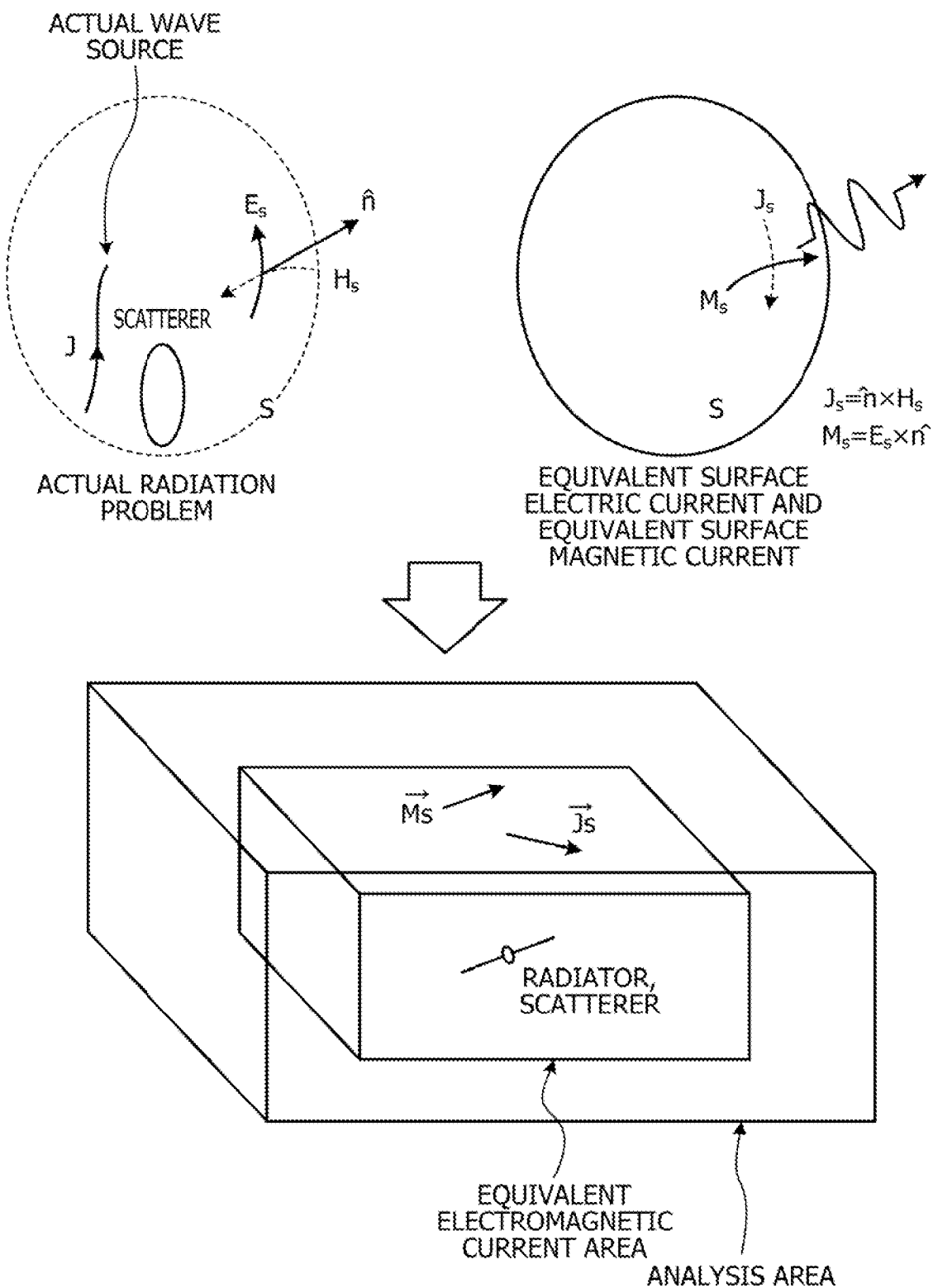
FIG. 1 is a diagram for explaining a method for calculating a far field using the equivalence theorem, which is a prior technique.

First, a traditional method for calculating a far field will be described. FIG. 1 is a diagram for explaining a method for calculating a far field using the equivalence theorem, which is a prior technique. The far field can be calculated by integrating equivalent electromagnetic currents on a closed curved surface S surrounding a radiator or scatterer. For example, as illustrated in FIG. 1, the far field is calculated by setting a rectangular parallelepiped surrounding the radiator or scatterer as an equivalent electromagnetic current area within an analysis area and integrating the equivalent electromagnetic currents on a surface of the equivalent electromagnetic current area.

For example, the equivalent electric current and equivalent magnetic current are calculated from the magnetic field and electric field using following formulas (1) and (2), respectively.

[Mathematical Formula 1]

$$js = \vec{n} \times \vec{H} \quad (1)$$

In formula (1), the portion indicated by Js represents the equivalent electric current, the portion indicated by H represents the magnetic field, and the portion indicated by n represents the unit normal vector on the equivalent electromagnetic current surface.

[Mathematical Formula 2]

$$\vec{Ms} = -\vec{n} \times \vec{E} \quad (2)$$

In formula (2), the portion indicated by Ms represents the equivalent magnetic current, and the portion indicated by E represents the electric field.

Then, for example, following formula (3) is used to calculate the far field in the frequency domain by calculating the far field in the time domain from the equivalent electromagnetic current in the time domain and conducting Fourier transformation on the calculated far field in the time domain.

[Mathematical Formula 3]

$$E_\theta(\omega) = F[E_\theta(t)] \quad (3)$$

Alternatively, for example, following formula (4) is used to calculate the far field in the frequency domain by conducting Fourier transformation on the equivalent electromagnetic current in the time domain.

[Mathematical Formula 4]

$$E_\phi(\omega) = F[E_\phi(t)] \quad (4)$$

Next, a memory capacity and an amount of computation involved in the computation of the far field will be described, and furthermore, a specific example of the memory capacity and the amount of computation in the case of a smartphone will be illustrated.

Figure 2:
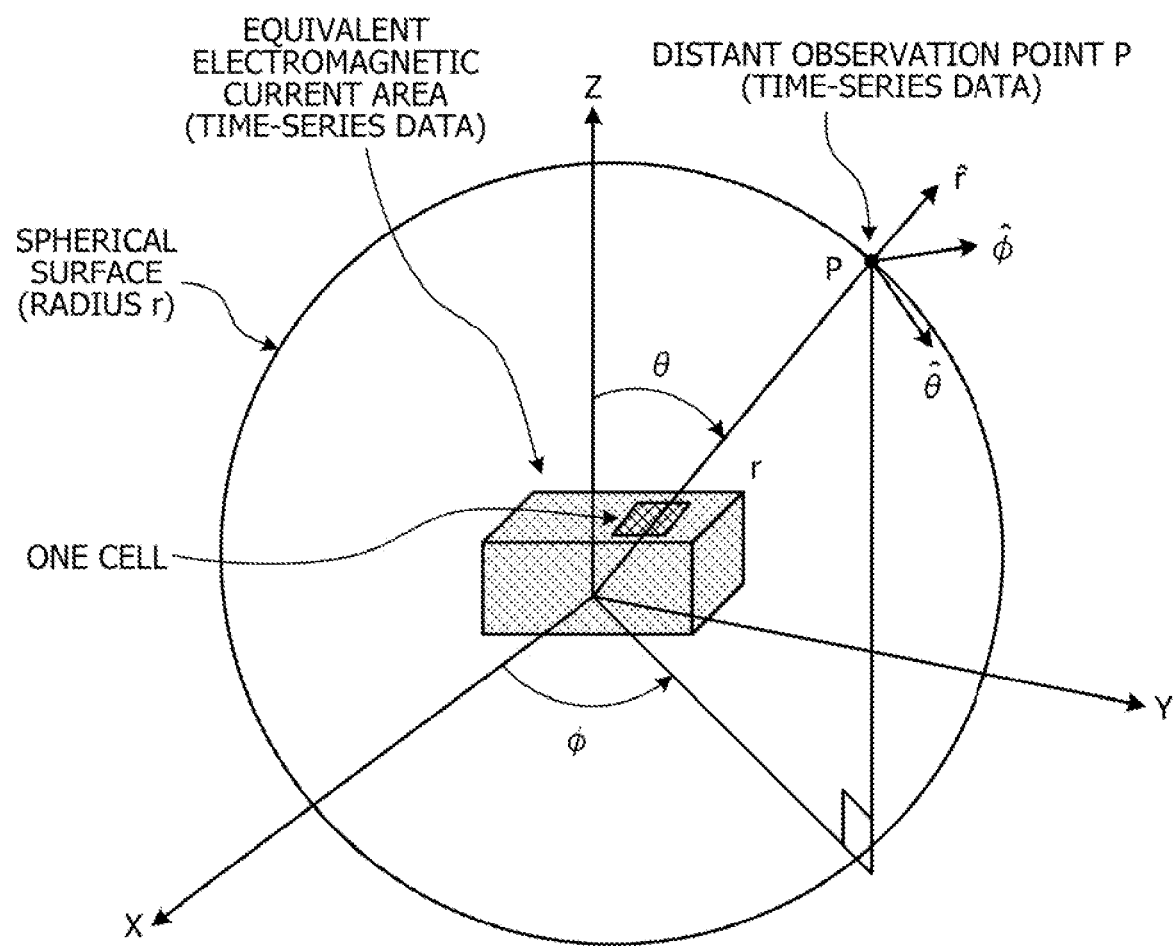
FIG. 2 is a diagram for explaining a memory capacity involved in the computation of the far field.

FIG. 2 is a diagram for explaining the memory capacity involved in the computation of the far field. The memory capacity involved in the computation of the far field can be calculated by, for example, the computational formula "(the number of equivalent electromagnetic current area cells+the number of distant observation points)×the number of pieces of time-series data". This computational formula is based on the idea that: (1) time-series data is involved to shorten the far-field computational time at a plurality of optional frequencies; (2) a memory area for the time-series data is involved for each cell in the equivalent electromagnetic current area; and (3) a memory area for the time-series data is involved for each distant observation point. Here, the cell refers to an area generated by dividing each plane of the equivalent electromagnetic current area, which is, for example, a rectangular parallelepiped or cubic area.

A more specific formula is "the memory capacity involved in the computation of the far field={2×(ab+bc+ac)+K}×2×n". In the above formula, a, b, and c represent the number of cells in an X-axis direction, the number of cells in a Y-axis direction, and the number of cells in a Z-axis direction, respectively, of the equivalent electromagnetic current area. In addition, in the above formula, K represents the number of distant observation points, and n represents the number of pieces of the time-series data, such as the number of samples.

Figure 3:
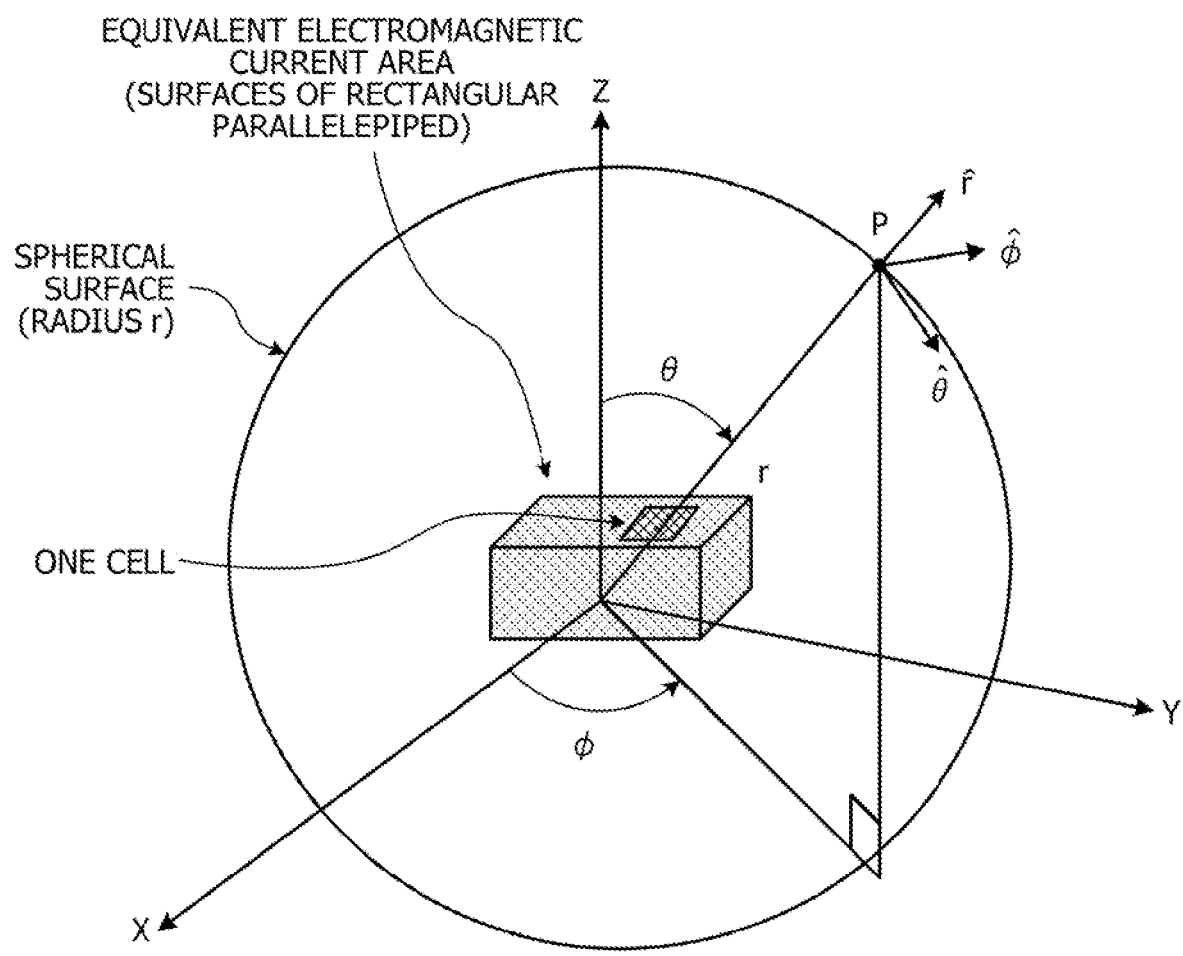
FIG. 3 is a diagram for explaining the amount of computation involved in the computation of the far field.

FIG. 3 is a diagram for explaining the amount of computation involved in the computation of the far field. The amount of computation involved in the computation of the far field can be calculated by, for example, the computational formula "the number of distant observation points×the number of equivalent electromagnetic current area cells×the number of pieces of time-series data". This computational formula is based on the idea that: (1) the distances of the distant observation point P from each cell in the equivalent electromagnetic current area are uneven, and (2) the far field at the distant observation point P is calculated for each cell in the equivalent electromagnetic current area and integral computation taking the phase difference into account is performed.

A more specific formula is "the amount of computation involved in the computation of the far field=K×2×(ab+bc+ac)×2×n". Each parameter in the above formula is similar to the parameters for the memory capacity involved in the computation of the far field.

FIG. 4 is a diagram for explaining the computation of the far field in a smartphone. For example, in the case of the smartphone, as illustrated in FIG. 4, electromagnetic waves are radiated from an antenna element in the lower part inside the housing.

In the smartphone illustrated in FIG. 4, it is assumed that the equivalent electromagnetic current area with a number of cells in the X-axis direction of 300, a number of cells in the Y-axis direction of 200, and a number of cells in the Z-axis direction of 500, and an analysis area of 350 millimeters (mm)×250 mm×250 mm are set to calculate the far field. In addition, the number of distant observation points, analysis time, analysis time interval, and number of pieces of time-series data are assumed as illustrated in the lower right of FIG. 4.

The memory capacity involved in the computation of the far field in this case is approximately 313.4 gigabytes (GByte) when computed by substituting each parameter value into the above formula "{2×(ab+bc+ac)+K}×2×n". Similarly, the amount of computation involved in the computation of the far field is approximately 40.5 PFlop when computed with five Flops per one time of computation, using the above formula "K×2×(ab+bc+ac)×2×n".

In this manner, the memory capacity and amount of computation involved in the computation of the far field are not small. However, the involved memory capacity and amount of computation tend to increase further due to the complication of the shape of models in far-field electromagnetic field simulations caused by the recent improvement in the performance and density of electronic devices.

Figure 5:
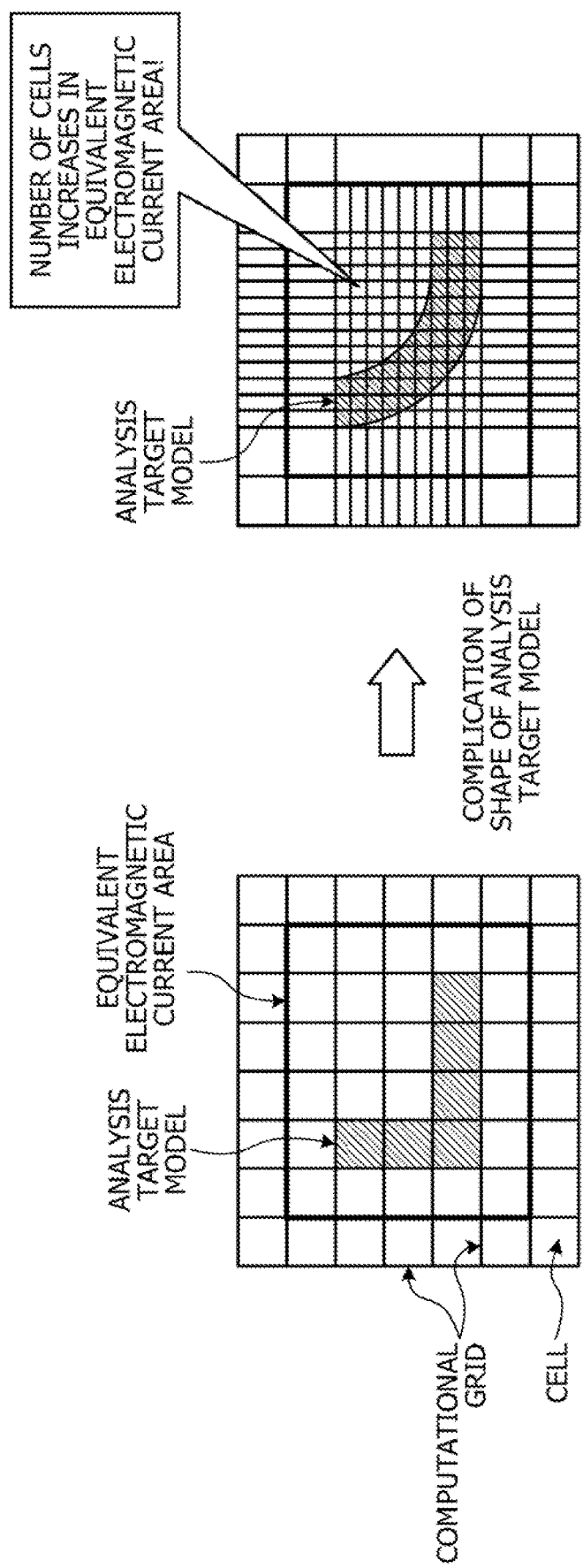
FIG. 5 is a diagram for explaining the refinement of a computational grid due to the complication of the shape of an analysis target model.

FIG. 5 is a diagram for explaining the refinement of a computational grid due to the complication of the shape of an analysis target model. As illustrated in FIG. 5, as the shape of the analysis target model becomes more complicated, the refinement of the computational grid advances, and the number of cells in the equivalent electromagnetic current area increases. As the number of cells in the equivalent electromagnetic current area increases, the value of the number of cells in the "ab+bc+ac" portion of the above formula used when calculating the memory capacity and amount of computation involved in the computation of the far field also becomes greater, and accordingly, the involved memory capacity and amount of computation also increase.

Therefore, the traditional method for calculating the far field involves large-scale computer resources and a huge amount of computational time in order to perform computation for recent electronic devices. Thus, one object of the present embodiment is to reduce the memory capacity and computational time involved in the computation of the far field.

In addition, regarding electromagnetic waves emitted from the electronic device, it is well known that transmission electromagnetic waves from the antenna are radiated from a location where the antenna is installed, and leaked electromagnetic waves are radiated from openings and gaps of the housing. Furthermore, it is well known that, even if the shape of the antenna or printed circuit board serving as the wave source changes and the amplitude of the wave source varies, the concentrated location and the non-concentrated location of the electromagnetic waves do not change. Thus, in the present embodiment, by utilizing such a property, a computer creates a thinned grid by thinning a computational grid for electromagnetic current computation, according to the electric field strength distribution in the equivalent electromagnetic current area, and computes the equivalent electromagnetic current and the far field, using the created thinned grid. Note that, although details will be described later, thinning the computational grid means dividing each of planes of the equivalent electromagnetic current area to generate a plurality of cells and merging a part of the cells, based on predetermined conditions for each of the planes, to generate the thinned grid. This allows to reduce the number of computational grids. As described above, in the present embodiment, by thinning the computational grid, the memory capacity and computational time involved in the computation of the far-field are reduced while computation results for the far field equal to the computation results in the prior technique are obtained.

[Functional Configuration of Simulation Device 10]

Figure 6:
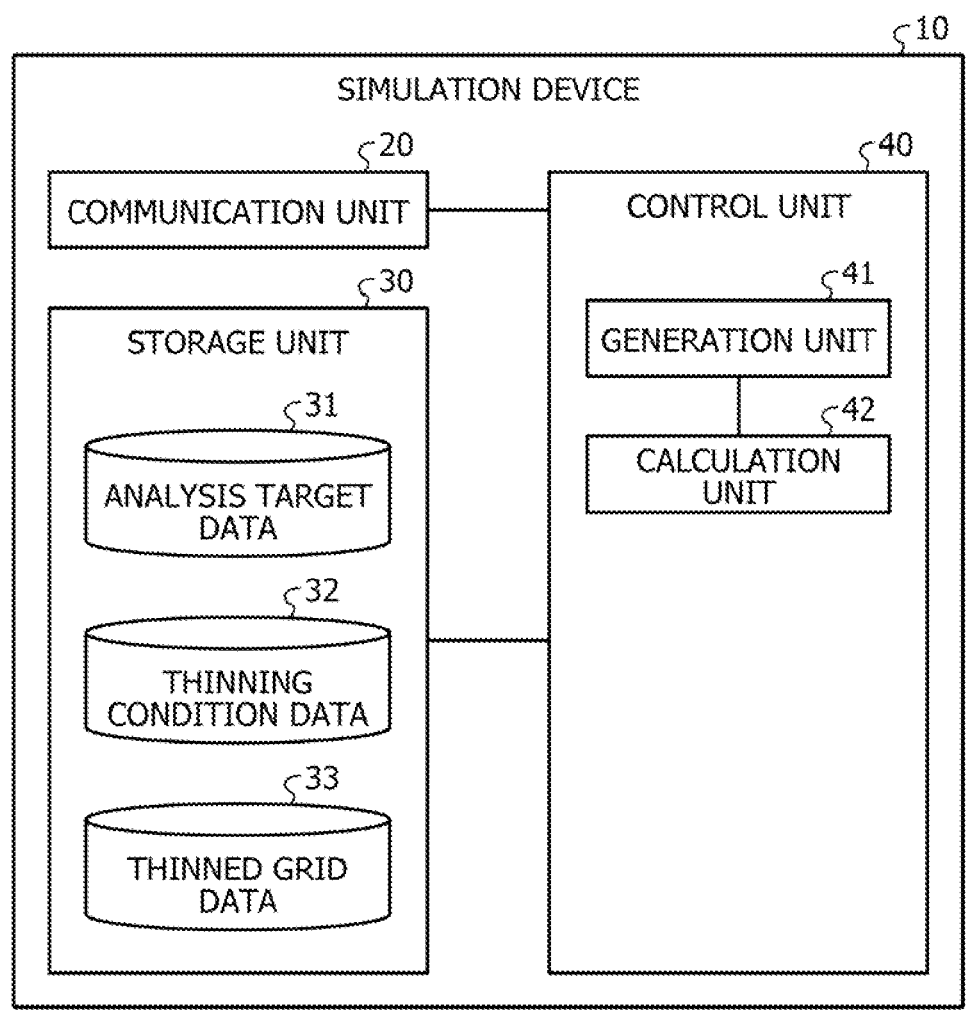
FIG. 6 is a diagram illustrating a configuration example of a simulation device 10 according to a first embodiment.

Next, a functional configuration of a simulation device 10, which is an information processing device that serves as the main part in the execution of the present embodiments, will be described. FIG. 6 is a diagram illustrating a configuration example of the simulation device 10 according to a first embodiment. As illustrated in FIG. 6, the simulation device 10 includes a communication unit 20, a storage unit 30, and a control unit 40.

The communication unit 20 is, for example, a processing unit that controls communication with another information processing device via a network 50 and is, for example, a communication interface such as a network interface card.

The storage unit 30 is an example of a storage device that stores various types of data and a program to be executed by the control unit 40 and, for example, is a memory, a hard disk, or the like. The storage unit 30 stores analysis target data 31, thinning condition data 32, thinned grid data 33, and the like.

The analysis target data 31 stores data relating to an analysis target of a far-field electromagnetic field simulation. Here, the data relating to the analysis target is, for example, data relating to the analysis area, the equivalent electromagnetic current area, the number of distant observation points, the analysis time, the analysis time interval, the number of pieces of time-series data, and the like, as illustrated on the right side of FIG. 4.

The thinning condition data 32 stores, for example, data relating to thinning conditions for the computational grid for electromagnetic current computation. Here, the data relating to the thinning conditions is, for example, data relating to the upper limit values of the number of vertical or horizontal grids in a thinning target range and the size of the thinning target range, the upper limit value of the electric field strength in the thinning target range, a variation coefficient of the electric field strength, and the like. Note that, as for the number of vertical and horizontal grids in the thinning target range, for example, when the number of each of grids is both two vertically and two horizontally, a thinned grid obtained by joining four grids of 2×2 into one is generated. In addition, the number of vertical and horizontal grids in the thinning target range does not have to be the same.

The thinned grid data 33 stores, for example, data relating to the thinned grid generated by thinning the computational grid for electromagnetic current computation. FIG. 7 is a diagram illustrating an example of the thinned grid data 33 according to the first embodiment. As illustrated in FIG. 7, for example, the thinned grid data 33 stores information on the number and interval of grids in each axial direction of each plane of the equivalent electromagnetic current area, the number of merged cells, and the like, in association with each other.

Note that the above-described various types of information stored in the storage unit 30 are merely examples, and the storage unit 30 may store diverse types of information other than the information described above.

The control unit 40 is a processing unit that controls the entire simulation device 10 and, for example, is a processor or the like. The control unit 40 includes a generation unit 41 and a calculation unit 42. Note that each of the processing units is an example of an electronic circuit included in the processor or an example of a process executed by the processor.

The generation unit 41 generates the thinned grid for electromagnetic current computation according to, for example, the electric field strength distribution in the equivalent electromagnetic current area. For example, the generation unit 41 calculates the electric field strength for each of cells generated by dividing each plane of the equivalent electromagnetic current area, which is a rectangular parallelepiped or cubic area, and generates the thinned grid by merging a predetermined number of cells, based on the calculated electric field strength.

Here, the process of generating the thinned grid may be a process of generating the thinned grid by merging all the cells in the thinning target range, for example, when the electric field strength of all the cells in the thinning target range including the predetermined number of cells is equal to or less than a predetermined upper limit value. Alternatively, the process may be a process of generating the thinned grid by merging all the cells in the thinning target range when the electric field strength of all the cells in the thinning target range including the predetermined number of cells is equal to or less than a first upper limit value and the variation coefficient of the electric field strength is equal to or less than a second upper limit value. Alternatively, the process may be a process of generating the thinned grid such that the vertical or horizontal size of the thinning target range is equal to or less than a predetermined upper limit value.

Note that, as the thinning conditions, the electric field strength of the cells in the thinning target range, the variation coefficient of the electric field strength, and the vertical or horizontal size of the thinning target range are given as examples, but these conditions may be combined and used as a compound condition. Furthermore, the thinning conditions are not limited to these conditions, and other conditions may be used in combination.

The calculation unit 42 calculates the equivalent electromagnetic current and the far field, for example, using the thinned grid generated by the generation unit 41.

Here, the process of calculating the equivalent electromagnetic current may be a process of calculating the electromagnetic current, for example, for each of the cells that are not merged for the thinned grid and for each thinned grid. In addition, the process of calculating the electromagnetic current for each thinned grid may be a process of calculating the magnetic current by integrating first calculation results for electric fields corresponding to the cells in the thinned grid when there is a plurality of the first calculation results. Alternatively, the process of calculating the electromagnetic current for each thinned grid may be a process of calculating the electric current by integrating second calculation results for magnetic fields corresponding to the cells in the thinned grid when there is a plurality of the second calculation results.

In addition, the process of calculating the far field may be a process of calculating the far field for each of the cells that are not merged for the thinned grid and for each thinned grid.

[Function Details]

Figure 8:
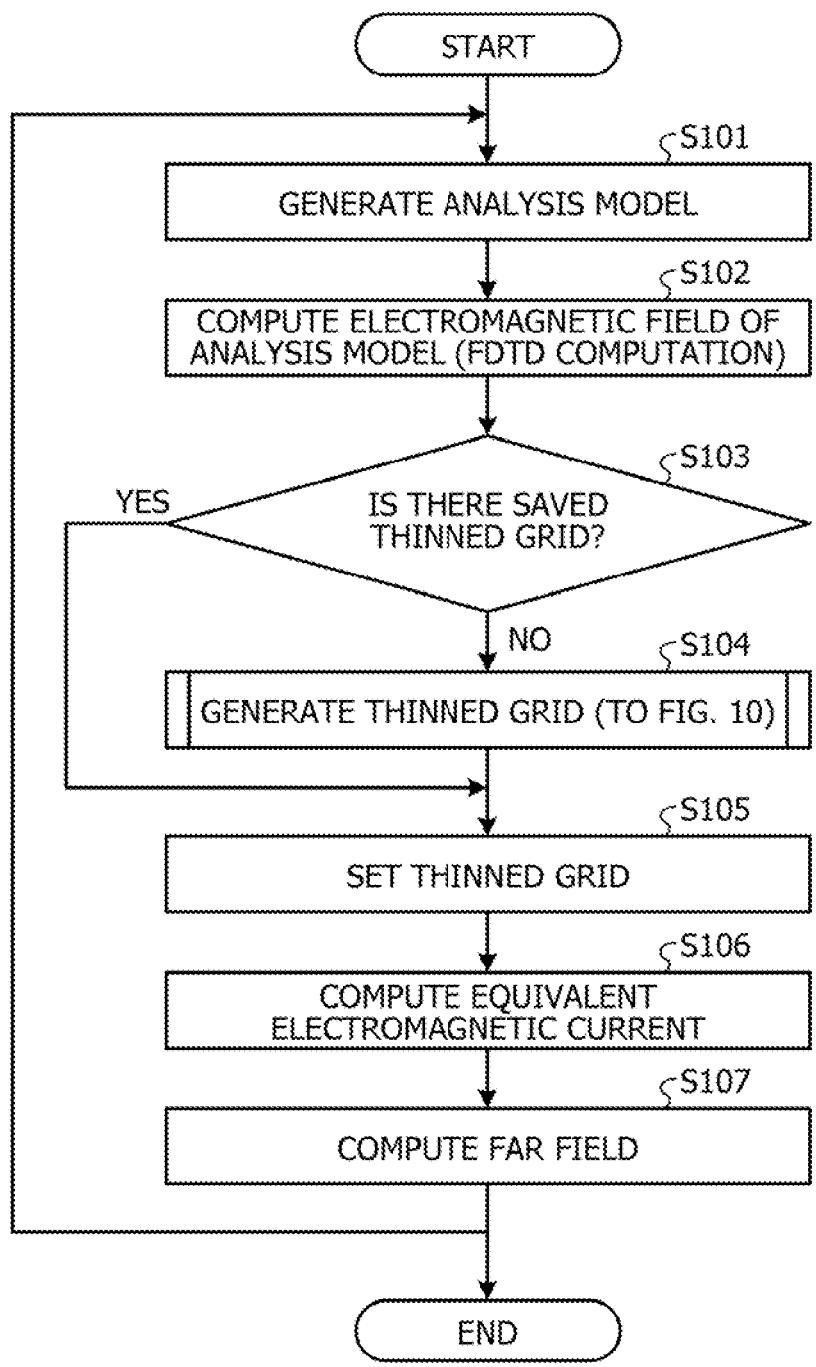
FIG. 8 is a flowchart illustrating an example of the flow of a simulation process according to the first embodiment.

Next, an example of a simulation process executed by the simulation device 10 will be described. FIG. 8 is a flowchart illustrating an example of the flow of the simulation process according to the first embodiment. The simulation process illustrated in FIG. 8 is a process of computing the electromagnetic field of an analysis model of an electronic device and generating a thinned grid for electromagnetic current computation, according to the electric field strength distribution in the equivalent electromagnetic current area, to calculate the equivalent electromagnetic current and the far field using the generated thinned grid.

Figure 9:
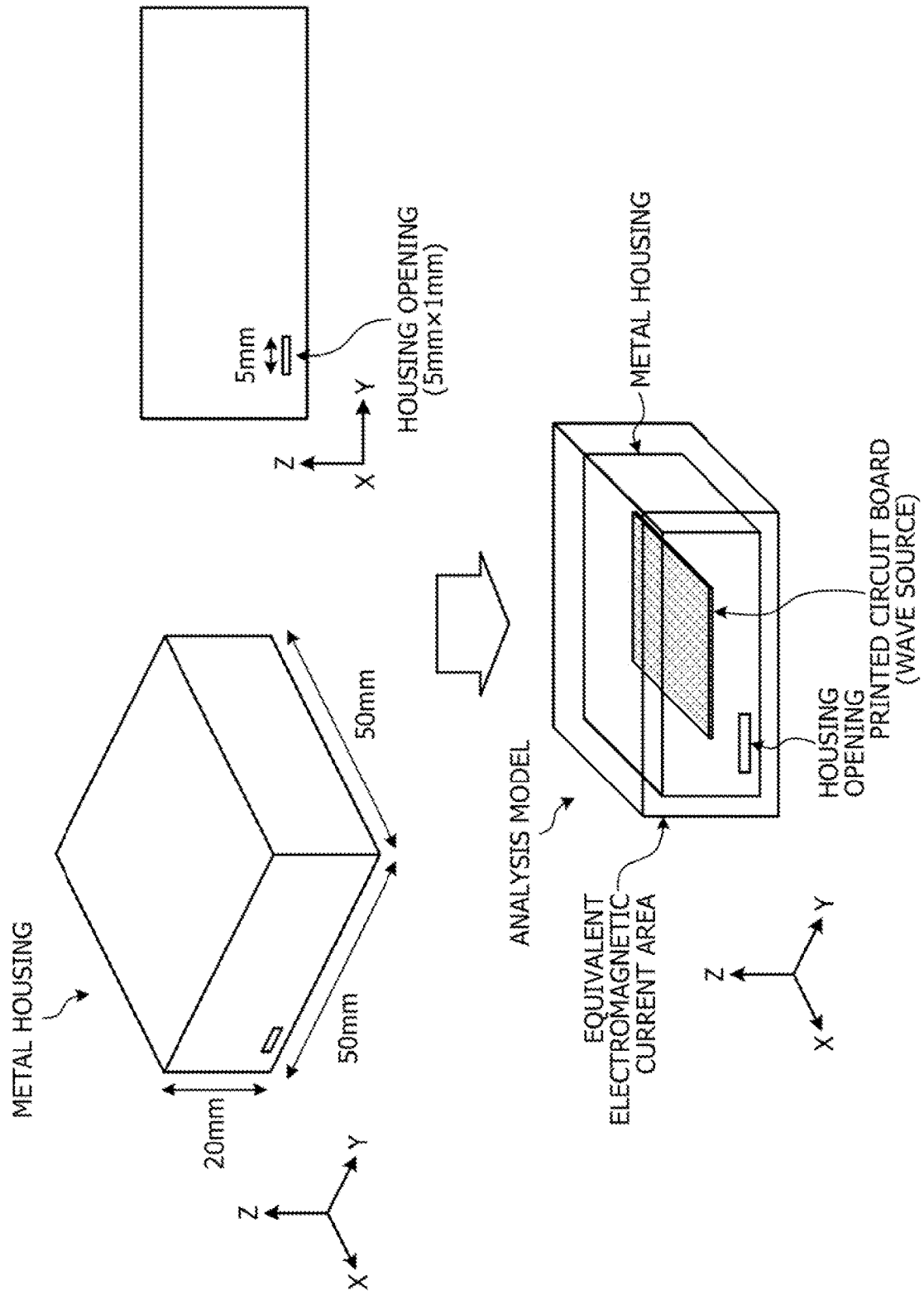
FIG. 9 is a diagram illustrating an example of analysis model generation according to the first embodiment.

First, as illustrated in FIG. 9, the simulation device 10 generates an analysis model of a target electronic device (step S101). FIG. 9 is a diagram illustrating an example of analysis model generation according to the first embodiment. As illustrated in FIG. 9, for example, when the target electronic device has a metal housing with a printed circuit board as a wave source, the simulation device 10 sets a predetermined range around the housing as the equivalent electromagnetic current area, based on, for example, data stored in the analysis target data 31, and generates an analysis model.

Next, the simulation device 10 computes the electromagnetic field of the analysis model generated in step S101 (step S102). For example, the simulation device 10 executes electromagnetic field computation employing the finite-difference time-domain (FDTD) method, which is an existing technique, and computes the electric field and the magnetic field in the entire analysis space of the analysis model generated in step S101. Note that the FDTD method is an approach for directly differentiating Maxwell's equations in the time domain.

Next, the simulation device 10 determines whether or not there is a saved thinned grid for the target electronic device (step S103). When there is a saved thinned grid (step S103: Yes), since the saved thinned grid can be reused, the saved thinned grid is acquired from the thinned grid data 33, and step S104 for generating the thinned grid is skipped to proceed to step S105.

Figure 10:
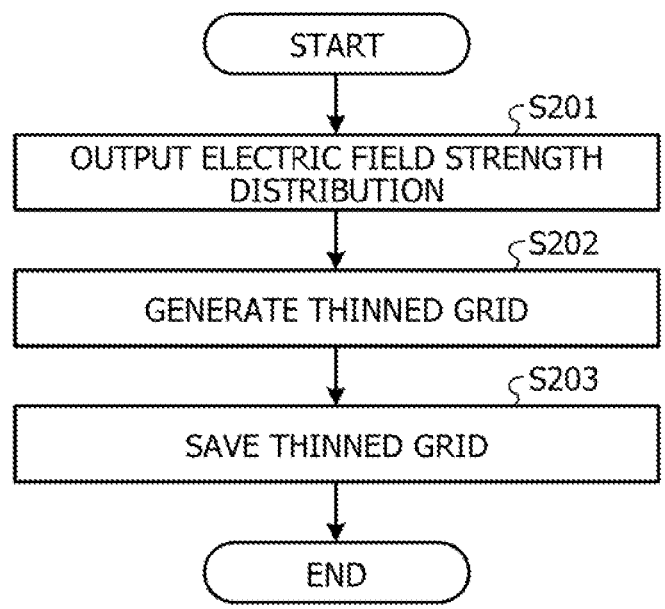
FIG. 10 is a flowchart illustrating an example of the flow of a thinned grid generation process according to the first embodiment.

On the other hand, when there is no saved thinned grid for the target electronic device (step S103: No), the simulation device 10 generates a thinned grid (step S104). The generation of the thinned grid is executed for each plane of the six-plane equivalent electromagnetic current area, for example, based on the flowchart illustrated in FIG. 10. FIG. 10 is a flowchart illustrating an example of the flow of a thinned grid generation process according to the first embodiment.

Figure 11:
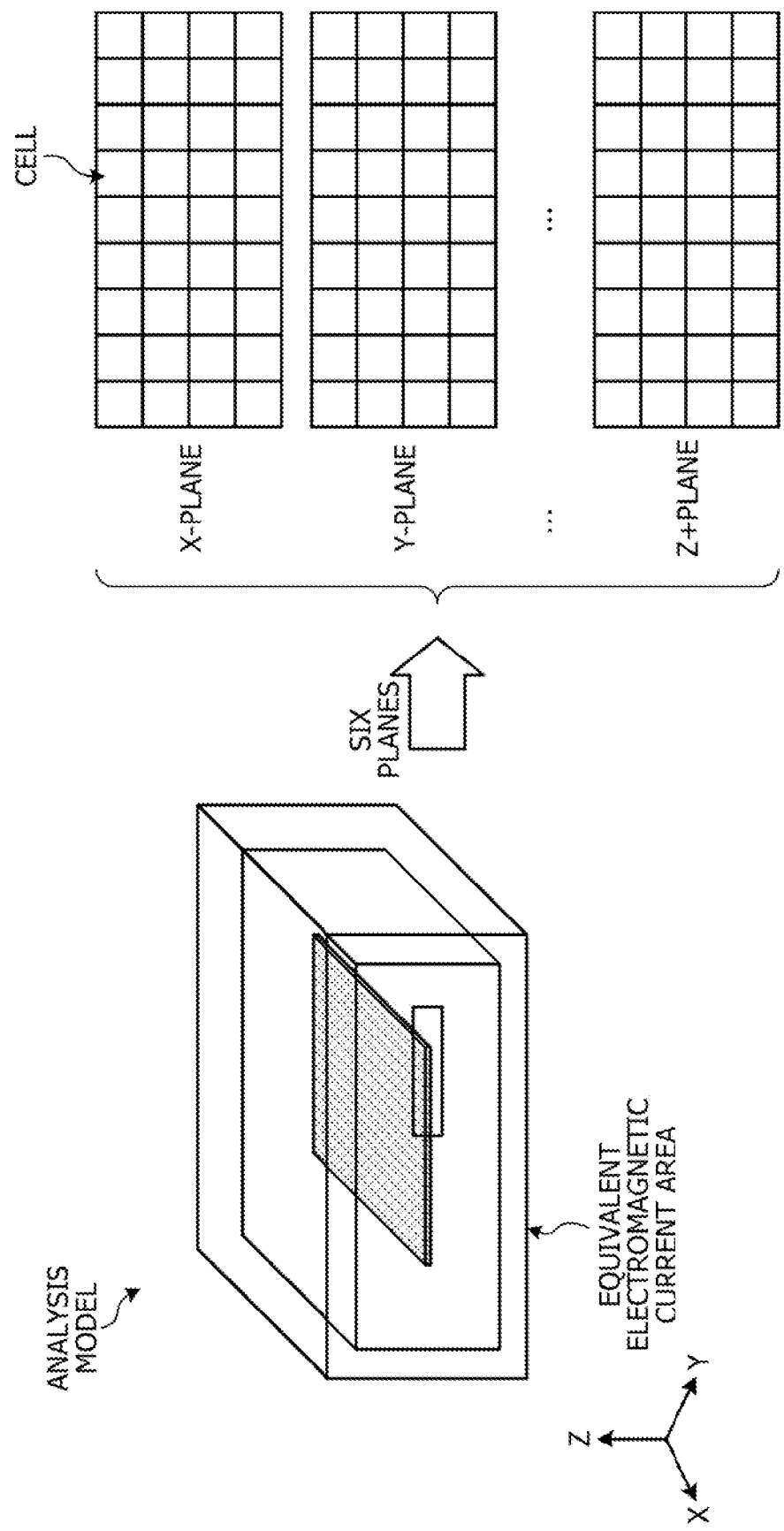
FIG. 11 is a diagram illustrating an example of electric field strength distribution output according to the first embodiment.

First, as illustrated in FIG. 10, the simulation device 10 outputs the electric field strength distribution, based on the computation result for the electromagnetic field computed in step S102 (step S201). The output of the electric field strength distribution will be described in detail. FIG. 11 is a diagram illustrating an example of electric field strength distribution output according to the first embodiment. As illustrated in FIG. 11, the respective six planes of the equivalent electromagnetic current area are assumed to be individually defined as X-plane, Y-plane, Z-plane, X+plane, Y+plane, and Z+plane. Each surface forms an electric field strength output area.

Then, the simulation device 10 calculates the maximum electric field strength value for each cell on each plane, which is the electric field strength output area. Furthermore, the simulation device 10 normalizes the maximum electric field strength values for each cell by the maximum value among all the cells on the six planes to output the normalized maximum electric field strength values. When this is represented in a specific formula, for example, "the output value=the maximum electric field strength value of each cell/max (the maximum electric field strength value among all the cells on the six planes)" is given.

Figure 12:
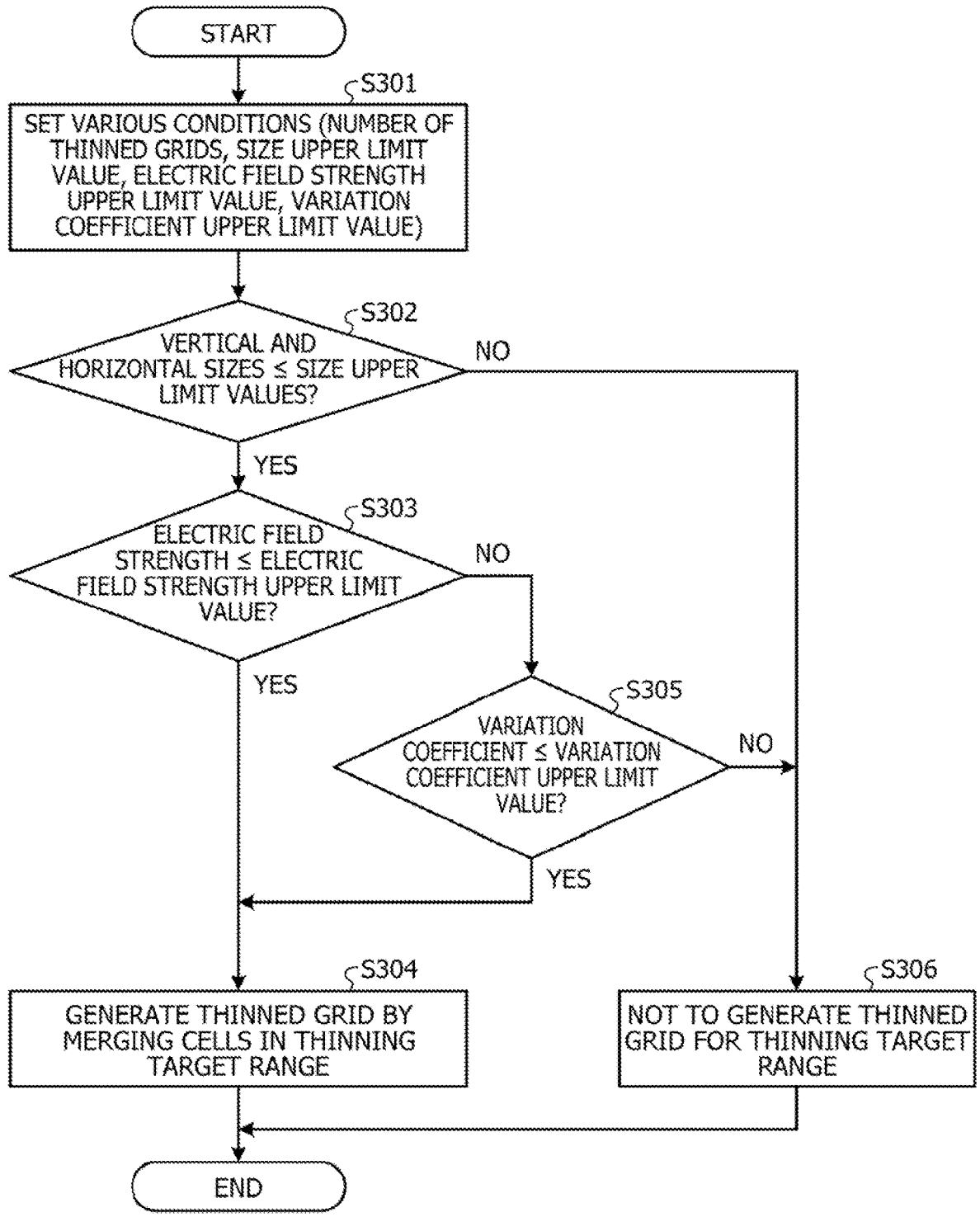
FIG. 12 is a flowchart illustrating an example of the flow of a thinned grid generation determination process according to the first embodiment.

Returning to the description of FIG. 10, next, the simulation device 10 generates the thinned grid based on the electric field strength distribution output in step S201 (step S202). For example, the simulation device 10 determines a range that satisfies all predetermined conditions, as a thinning permissible range, for each thinned grid size range in the grid in the six-plane equivalent electromagnetic current area, and generates the thinned grid by merging the cells in the thinning target range. Note that, for example, the predetermined conditions for generating the thinned grid include the upper limit values of the number of vertical or horizontal grids in the thinning target range and the size of the thinning target range, the upper limit value of the electric field strength in the thinning target range, the variation coefficient of the electric field strength, and the like, which are stored in advance in the thinning condition data 32. Determination as to whether or not to generate the thinned grid is executed, for example, based on the flowchart illustrated in FIG. 12. FIG. 12 is a flowchart illustrating an example of the flow of a thinned grid generation determination process according to the first embodiment.

First, as illustrated in FIG. 12, the simulation device 10 sets various conditions for generating the thinned grid (step S301). This means, for example, acquiring various types of condition data stored in advance in the thinning condition data 32 in order to use the acquired condition data as parameters of determination conditions as to whether or not to generate the thinned grid. In addition, for example, the above-mentioned condition data includes the upper limit values of the number of vertical or horizontal grids in the thinning target range and the size of the thinning target range, the upper limit value of the electric field strength in the thinning target range, the variation coefficient of the electric field strength, and the like. Then, based on the number of vertical or horizontal grids in the thinning target range acquired from the thinning condition data 32, the simulation device 10 specifies a range of the number of vertical grids×the number of horizontal grids, as the thinning target range.

Figure 13:
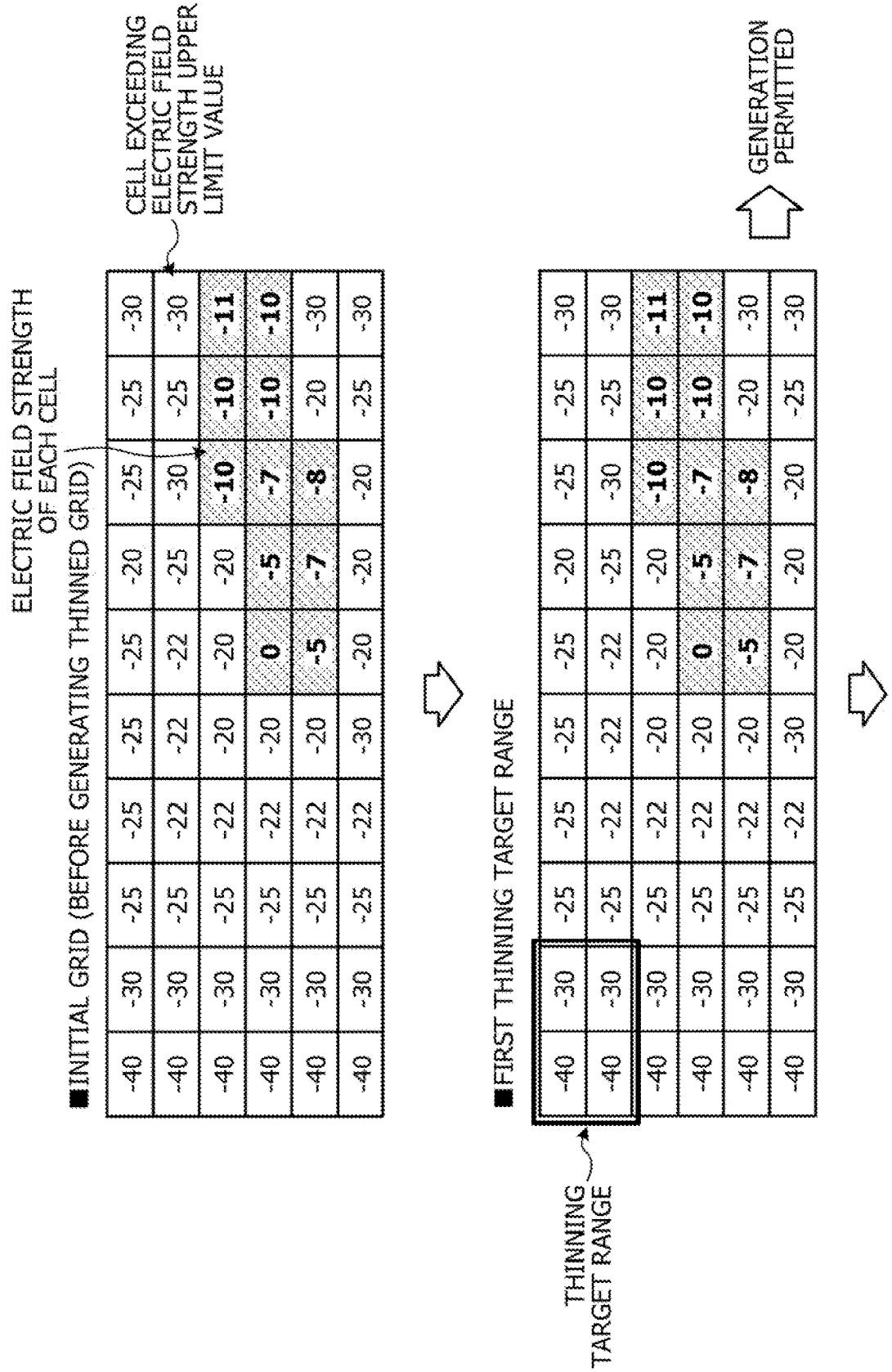
FIG. 13 is a diagram illustrating an example of a thinned grid process (1) according to the first embodiment.

FIG. 13 is a diagram illustrating an example of a thinned grid process (1) according to the first embodiment. As illustrated in the lower part of FIG. 13, the example in FIG. 13 is an example in which the thinning target range is specified to be four cells of two vertically×two horizontally. The subsequent processes in steps S302 to S306 are executed for each thinning target range. In the example in FIG. 13, the processes are first executed on the upper left four cells of two vertically×two horizontally as the thinning target range. Thereafter, for example, the thinning target range is shifted to the right, and the next thinning target range is processed. Therefore, the processes in steps S302 to S306 will be repeated until the process is executed on all thinning target ranges.

Returning to the description of FIG. 12, next, the simulation device 10 determines whether the vertical and horizontal sizes of the thinning target range are within the upper limit values for each size acquired from the thinning condition data 32 (step S302). This determination is to restrict the thinning target only to when the vertical and horizontal sizes of the thinning target range are equal to or less than the upper limit values for each size, in order to minimize the influence on the analysis accuracy of the far-field electromagnetic field simulation. When either the vertical or horizontal size of the thinning target range is greater than the upper limit value (step S302: No), the simulation device 10 specifies not to generate the thinned grid for the thinning target range (step S306). After the execution of step S306, when there is no next thinning target range, the thinned grid generation determination process illustrated in FIG. 12 ends to return to the flowchart in FIG. 10 and proceed to step S203. On the other hand, when there is the next thinning target range, the process returns to step S302, and the processes in steps S302 to S306 are repeated until the process is executed on all thinning target ranges.

On the other hand, when the vertical and horizontal sizes of the thinning target range are within the upper limit values (step S302: Yes), the simulation device 10 determines whether the electric field strength in the thinning target range is within the upper limit value of the electric field strength acquired from the thinning condition data 32 (step S303). This determination is also to minimize the influence on the analysis accuracy of the far-field electromagnetic field simulation. When the electric field strength in the thinning target range is within the upper limit value (step S303: Yes), the simulation device 10 generates the thinned grid by merging the cells in the thinning target range (step S304). Also after the execution of step S304, when there is the next thinning target range, the process returns to step S302, and when there is no next thinning target range, the process returns to the flowchart in FIG. 10.

On the other hand, when the electric field strength in the thinning target range is higher than the upper limit value (step S303: No), the simulation device 10 determines whether the variation coefficient of the electric field strength in the thinning target range is within the upper limit value of the variation coefficient acquired from the thinning condition data 32 (step S305). This determination is also to minimize the influence on the analysis accuracy of the far-field electromagnetic field simulation. The variation coefficient of the electric field strength in the thinning target range is, for example, a value obtained by dividing the standard deviation of the electric field strength in the thinning target range by the average value of the electric field strength in the thinning target range. When the variation coefficient of the thinning target range is within the upper limit value (step S305: Yes), the simulation device 10 generates the thinned grid by merging the cells in the thinning target range (step S304). On the other hand, when the variation coefficient of the thinning target range is higher than the upper limit value (step S305: No), the simulation device 10 specifies not to generate the thinned grid for the thinning target range (step S306).

This completes the description of the flowchart of the thinned grid generation determination process illustrated in FIG. 12, but an example of the process will be described with reference to FIGS. 13 to 18. FIGS. 13 to 18 are diagrams for explaining the flow of a series of processes executed by the simulation device 10, including a determination process as to whether or not to generate the thinned grid and the thinned grid generation process, as a thinned grid process.

FIG. 13 is a diagram illustrating an example of a thinned grid process (1) according to the first embodiment. The initial grid illustrated in the upper part of FIG. 13 is an example of a cell group obtained by dividing one plane of the equivalent electromagnetic current area into six vertically×ten horizontally. The numerical value inside each cell indicates the electric field strength, and the hatched cells indicate cells that exceed the upper limit value of the electric field strength when the upper limit value is assumed to be −20 decibel (dB). In addition, the upper limit value of the variation coefficient of the electric field strength in the thinning target range is assumed to be 0.05. Note that the variation coefficient of the electric field strength in the thinning target range is, for example, a value obtained by dividing the standard deviation of the electric field strength in the thinning target range by the average value of the electric field strength in the thinning target range. In addition, as illustrated in the lower part of FIG. 13, it is assumed that the thinning target range is processed with four cells of two vertically×two horizontally as a target range. It is also assumed that the vertical and horizontal sizes of the thinning target range are within the upper limit values.

First, in the example illustrated in the lower part of FIG. 13, the upper left four cells are assigned as the first thinning target range, and the electric field strength of each cell within the target range is used to determine whether or not to generate the thinned grid. Since the electric field strength of each cell within the first thinning target range is within the upper limit value, in considering by applying to the flowchart in FIG. 12, the process proceeds to step S304 through the Yes route in step S303, and the thinned grid is generated by merging the cells within the first thinning target range. For example, it is determined to generate the thinned grid for the first thinning target range.

FIG. 14 is a diagram illustrating an example of the thinned grid process (2) according to the first embodiment. As illustrated in the upper part of FIG. 14, the cells within the first thinning target range are merged to generate one thinned grid. Then, as illustrated in the lower part of FIG. 14, the thinning target range is shifted, and the thinned grid is generated for the second to seventh thinning target ranges. Note that, also for the second to seventh thinning target ranges, as in the first thinning target range, the electric field strength of each cell within the thinning target range is within the upper limit value of −20 dB, and it has been thus determined that the thinned grid is generated.

FIG. 15 is a diagram illustrating an example of the thinned grid process (3) according to the first embodiment. The upper part of FIG. 15 illustrates the process for the eighth thinning target range. As for the eighth thinning target range, since the electric field strength of the lower right cell in the thinning target range exceeds the upper limit value of −20 dB, in considering by applying to the flowchart in FIG. 12, the process proceeds to step S305 through the No route in step S303. In addition, the variation coefficient of the electric field strength in the eighth thinning target range is approximately 4.33 when calculated by the computational formula "(the standard deviation of the electric field strength in the thinning target range/the average value of the electric field strength in the thinning target range)", which exceeds the upper limit value of the variation coefficient of 0.05. When the determination of the variation coefficient is also considered by applying to the flowchart in FIG. 12, the process proceeds to step S306 through the No route in step S305, and it is specified not to generate the thinned grid for the eighth thinning target range.

Therefore, as illustrated in the lower part of FIG. 15, four cells remain without being thinned out in the eighth thinning target range. In addition, in the ninth thinning target range, as in the eighth thinning target range, the electric field strength and the variation coefficient within the thinning target range exceed the upper limit values, and accordingly, no thinned grid is generated.

FIG. 16 is a diagram illustrating an example of the thinned grid process (4) according to the first embodiment. FIG. 16 illustrates the process for the tenth to twelfth thinning target ranges. In the tenth to twelfth thinning target ranges, as in the first to seventh thinning target ranges, the electric field strength of each cell within the thinning target range is within the upper limit value of −20 dB, and accordingly, the thinned grid is generated.

Figure 17:
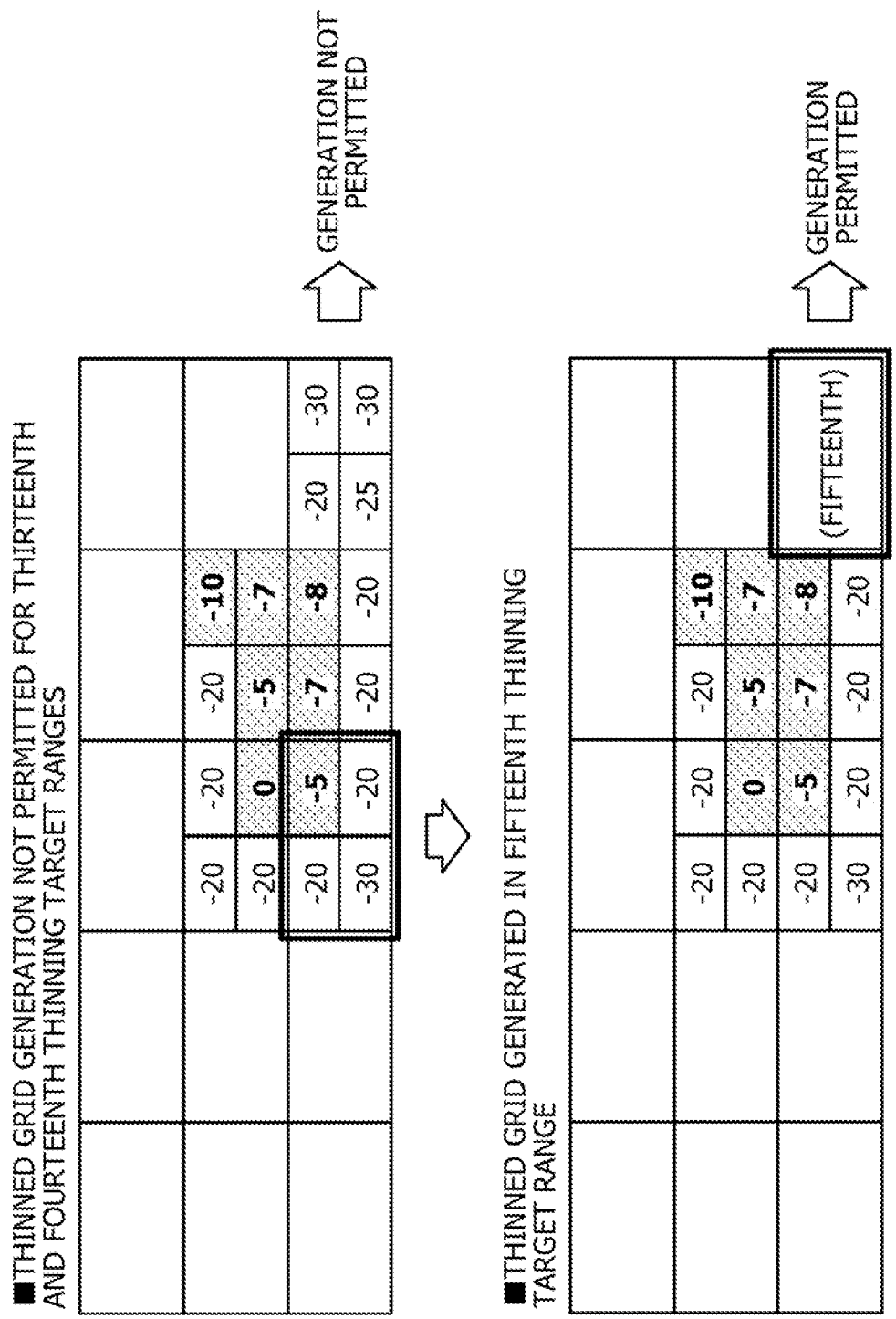
FIG. 17 is a diagram illustrating an example of the thinned grid process (5) according to the first embodiment.

FIG. 17 is a diagram illustrating an example of the thinned grid process (5) according to the first embodiment. FIG. 17 illustrates the process for the thirteenth to fifteenth thinning target ranges. In the thirteenth and fourteenth thinning target ranges, as in the eighth and ninth thinning target ranges, the electric field strength and the variation coefficient within the thinning target range exceed the upper limit values, and accordingly, no thinned grid is generated. In addition, in the fifteenth thinning target range, as in the first to seventh thinning target ranges, the electric field strength of each cell within the thinning target range is within the upper limit value of −20 dB, and accordingly, the thinned grid is generated.

In this manner, the thinning target range is shifted, and the determination process as to whether or not to generate the thinned grid and the thinned grid generation process are executed for all the thinning target ranges. FIG. 18 is a diagram illustrating an example of cells when the thinned grid generation process according to the first embodiment is completed. FIG. 18 illustrates the thinned grid after the determination process as to whether or not to generate the thinned grid and the thinned grid generation process are executed for the first to fifteenth thinning target ranges illustrated in FIGS. 13 to 17. Comparing the thinned grid after each process illustrated in FIG. 18 with the initial grid illustrated in the upper part of FIG. 13, the initial grid has 60 cells, while the thinned grid after each process has 27 cells, which means that 33 cells are thinned out, and the number of cells can be reduced by 55%.

Returning to the description of FIG. 10, next, the simulation device 10 stores and saves the thinned grid generated in step S202 in, for example, the thinned grid data 33 (step S203). Note that, not only in the simulation process this time, but the saved thinned grid can be reused, for example, also when simulating the same analysis model by altering parameters and the like. After the execution of step S203, the thinned grid generation process illustrated in FIG. 10 ends to return to the flowchart in FIG. 8 and proceed to step S105.

Next, the simulation device 10 sets the thinned grid for use in computing the equivalent electromagnetic current and the far field (step S105). Note that the thinned grids are set for each plane of the six-plane equivalent electromagnetic current area. In addition, the thinned grids set here are the thinned grids generated in step S104 or the saved thinned grids acquired in the Yes route of step S103.

Next, the simulation device 10 computes the equivalent electromagnetic current (step S106). For example, the simulation device 10 calculates the equivalent electromagnetic current for each cell of the thinned grids set in step S105, for each plane of the six-plane equivalent electromagnetic current area, based on the computation result for the electromagnetic field computed in step S102. The equivalent electric current is calculated by, for example, the computational formula "$J=n \times H$". The equivalent magnetic current is calculated by, for example, the computational formula "$M=-n \times E$". In each computational formula, J represents the equivalent electric current, M represents the equivalent magnetic current, H represents the magnetic field, E represents the electric field, and n represents the unit normal vector on the equivalent electromagnetic current surface.

FIG. 19 is a diagram illustrating an example of an equivalent electromagnetic current calculation process according to the first embodiment. FIG. 19 illustrates an example of computation of the equivalent electric current for the thinned grid after the thinned grid generation process illustrated in FIG. 18 is executed. For example, as illustrated in FIG. 19, since four cells remain without being thinned out in the eighth thinning target range, equivalent electric currents $J_{24}$, $J_{25}$, $J_{34}$, and $J_{35}$ are calculated using the magnetic fields $H_{24}$, $H_{25}$, $H_{34}$, and $H_{35}$, respectively, for each cell. In this manner, the equivalent electric current of each cell is calculated using the magnetic field for each cell in the thinning target range in which the thinned grid has not been generated.

On the other hand, for example, as illustrated in FIG. 19, when the thinned grid is generated as in the fifteenth thinning target range, magnetic fields $H_{48}$, $H_{49}$, $H_{58}$, and $H_{59}$ corresponding to each cell of the thinned grid are integrated, and an equivalent electric current $J_{48}$ is calculated. In this manner, for the thinning target range in which the thinned grid is generated, the equivalent electric current of the thinned grid is calculated by integrating the magnetic fields corresponding to each cell of the thinned grid.

Note that, by replacing the magnetic field H portion in FIG. 19 with the electric field E and the equivalent electric current J portion with the equivalent magnetic current M separately, the equivalent magnetic current can be similarly computed.

Figure 20:
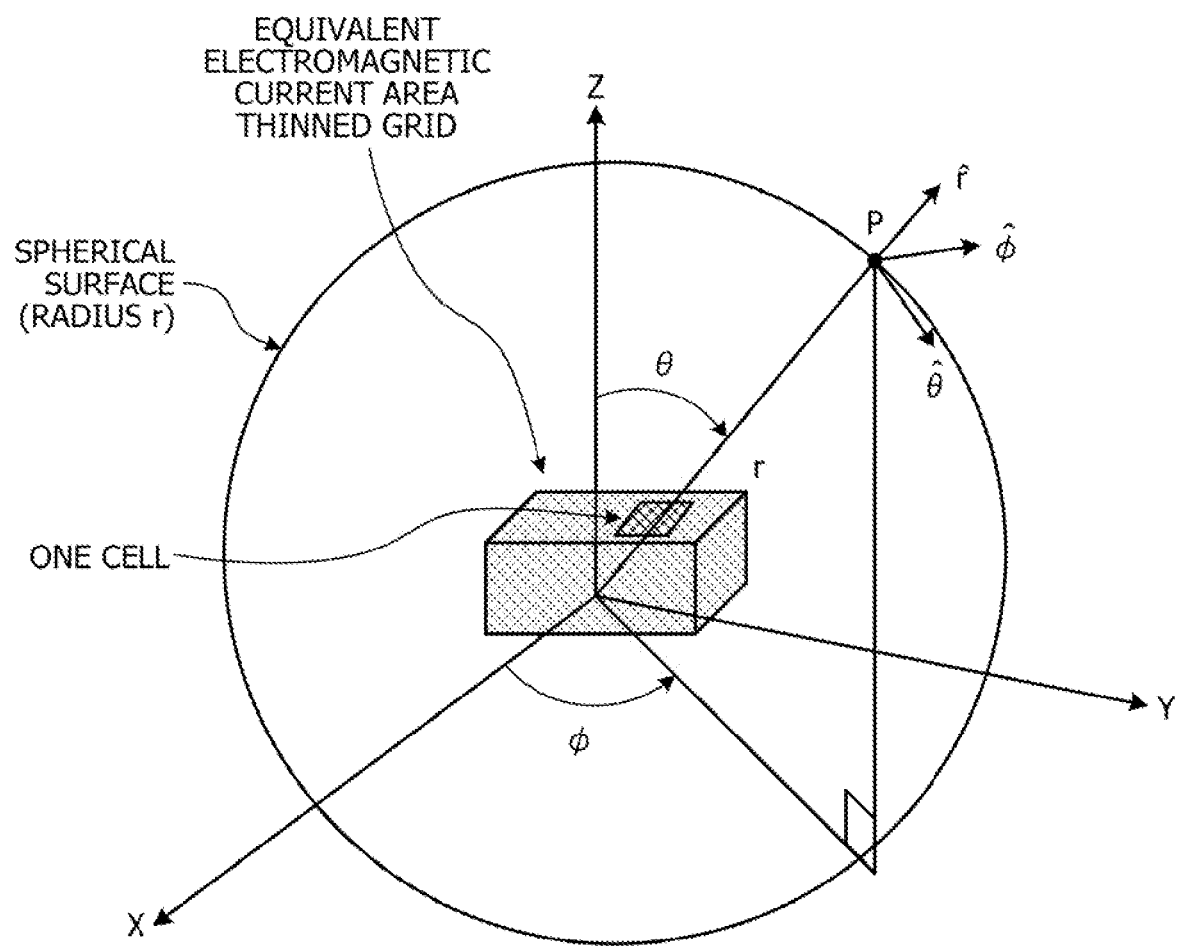
FIG. 20 is a diagram illustrating an example of a far-field calculation process according to the first embodiment.

Returning to the description of FIG. 8, next, the simulation device 10 computes the far field (step S107). FIG. 20 is a diagram illustrating an example of a far-field calculation process according to the first embodiment. The simulation device 10 calculates the far field at the distant observation point P for each cell of the thinned grids set in step S105 and performs integral computation by taking the phase difference in the far field into account. In addition, the memory capacity involved in the computation of the far field is calculated by, for example, the computational formula "the memory capacity=$\{m+K\} \times 2 \times n$". In addition, the amount of computation of the far field is calculated by, for example, the computational formula "the amount of computation=$K \times m \times 2 \times n$". In each computational formula, K represents the number of distant observation points, n represents the number of pieces of time-series data (the number of samples), and m represents the total number of cells in the equivalent electromagnetic current area (thinned grid). After the execution of step S107, the simulation process illustrated in FIG. 8 ends.

Effects

As described above, the simulation device 10 generates the thinned grid for electromagnetic current computation, according to the electric field strength distribution in the equivalent electromagnetic current area, and calculates the equivalent electromagnetic current and the far field, using the thinned grid.

In this manner, the simulation device 10 calculates the equivalent electromagnetic current and the far field using the thinned grid generated by merging the cells on each plane of the equivalent electromagnetic current area, according to the electric field strength distribution, and accordingly, may reduce the involved memory capacity and time while maintaining the computation accuracy for the far field.

In addition, the process of generating the thinned grid, which is executed by the simulation device 10, includes a process of calculating the electric field strength for each of cells generated by dividing each plane of the equivalent electromagnetic current area, which is a rectangular parallelepiped or cubic area, and generating the thinned grid by merging a predetermined number of cells, based on the electric field strength.

This allows the simulation device 10 to reduce the involved memory capacity and time while maintaining the computation accuracy for the far field.

In addition, the process of generating the thinned grid by merging the predetermined number of cells, which is executed by the simulation device 10, includes a process of generating the thinned grid by merging all the cells in the thinning target range when the electric field strength of all the cells in the thinning target range including the predetermined number of cells is equal to or less than a predetermined upper limit value.

This allows the simulation device 10 to reduce the involved memory capacity and time while maintaining the computation accuracy for the far field.

In addition, the process of generating the thinned grid by merging the predetermined number of cells, which is executed by the simulation device 10, includes a process of generating the thinned grid by merging all the cells in the thinning target range when the electric field strength of all the cells in the thinning target range including the predetermined number of cells is equal to or less than the first upper limit value and the variation coefficient of the electric field strength for all the cells in the thinning target range is equal to or less than the second upper limit value.

This allows the simulation device 10 to reduce the involved memory capacity and time while maintaining the computation accuracy for the far field.

In addition, the process of generating the thinned grid by merging the predetermined number of cells, which is executed by the simulation device 10, includes a process of generating the thinned grid such that the vertical or horizontal size of the thinning target range is equal to or less than a predetermined upper limit value.

This allows the simulation device 10 to reduce the involved memory capacity and time while maintaining the computation accuracy for the far field.

In addition, the process of calculating the equivalent electromagnetic current, which is executed by the simulation device 10, includes a process of calculating the electromagnetic current for each of the cells that are not merged for the thinned grid and for each thinned grid.

This allows the simulation device 10 to reduce the involved memory capacity and time while maintaining the computation accuracy for the far field.

In addition, the process of calculating the electromagnetic current for each thinned grid, which is executed by the simulation device 10, includes a process of calculating the magnetic current by integrating first calculation results for electric fields corresponding to the cells in the thinned grid when there is a plurality of the first calculation results, and calculating the electric current by integrating second calculation results for magnetic fields corresponding to the cells in the thinned grid when there is a plurality of the second calculation results.

This allows the simulation device 10 to reduce the involved memory capacity and time while maintaining the computation accuracy for the far field.

In addition, the process of calculating the far field, which is executed by the simulation device 10, includes a process of calculating the far field for each of the cells that are not merged for the thinned grid and for each thinned grid.

This allows the simulation device 10 to reduce the involved memory capacity and time while maintaining the computation accuracy for the far field.

[System]

The processing procedure, the control procedure, the specific name, and information including various types of data and parameters indicated in the description above or in the drawings may be optionally altered unless otherwise noted. In addition, the specific examples, distribution, numerical values, and the like described in the embodiments are merely examples and may be optionally altered.

In addition, each component of each device illustrated in the drawings is functionally conceptual and does not necessarily have to be physically configured as illustrated in the drawings. For example, specific forms of distribution and integration of individual devices are not limited to those illustrated in the drawings. For example, all or a part of the devices may be configured by being functionally or physically distributed or integrated in any units, according to various types of loads, usage situations, or the like. Moreover, all or any part of individual processing functions performed by each device may be implemented by a central processing unit (CPU), a graphics processing unit (GPU), and a program analyzed and executed by the CPU and the GPU, or may be implemented as hardware by wired logic.

[Hardware]

Figure 21:
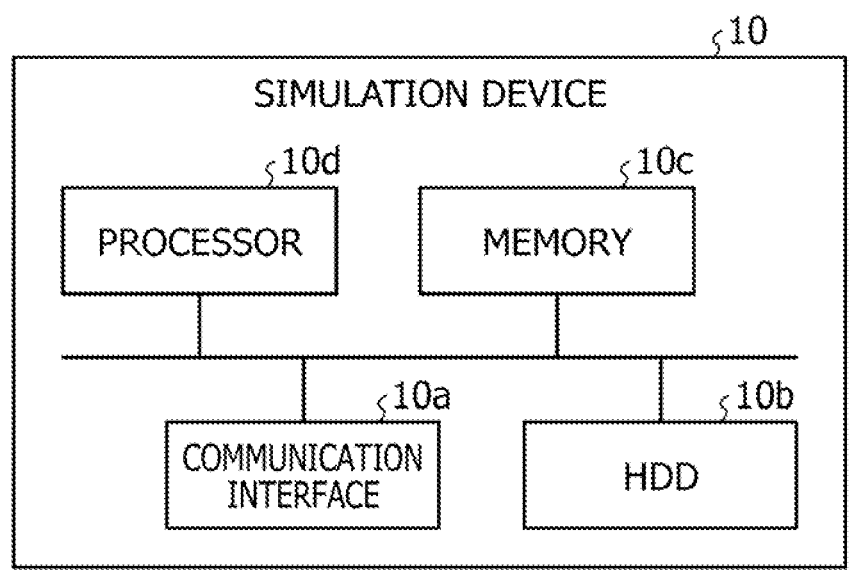
FIG. 21 is a diagram explaining a hardware configuration example of the simulation device 10.

FIG. 21 is a diagram explaining a hardware configuration example of the simulation device 10. As illustrated in FIG. 21, the simulation device 10 includes a communication interface 10a, a hard disk drive (HDD) 10b, a memory 10c, and a processor 10d. In addition, the respective units illustrated in FIG. 21 are interconnected by a bus or the like.

The communication interface 10a is a network interface card or the like and communicates with another server. The HDD 10b stores a program that activates the functions illustrated in FIG. 6, and a database (DB).

The processor 10d is a hardware circuit that reads a program that executes processing similar to the processing of each processing unit illustrated in FIG. 6, from the HDD 10b or the like, and loads the read program into the memory 10c to activate a process that executes each function described with reference to FIG. 6 and the like. For example, this process executes a function similar to the function of each processing unit included in the simulation device 10. For example, the processor 10d reads, from the HDD 10b or the like, a program having functions similar to the functions of the generation unit 41, the calculation unit 42, and the like. Then, the processor 10*d* executes a process that executes processing similar to the processing of the generation unit 41, the calculation unit 42, and the like.

In this manner, the simulation device 10 operates as an information processing device that executes an operation control process, by reading and executing the program that executes processing similar to the processing of each processing unit illustrated in FIG. 6. In addition, the simulation device 10 may also implement functions similar to the functions of the embodiments described above, by reading the program from a recording medium by a medium reading device and executing the read program. Note that, the program referred to in other embodiments is not limited to being executed by the simulation device 10. For example, the present embodiments may be similarly applied to a case where another computer or server executes the program, or a case where these computer and server cooperatively execute the program.

In addition, the program that executes processing similar to the processing of each processing unit illustrated in FIG. 6 may be distributed via a network such as the Internet. In addition, this program may be recorded in a computer-readable recording medium such as a hard disk, a flexible disk (FD), a compact disc read only memory (CD-ROM), a magneto-optical disk (MO), or a digital versatile disc (DVD) and may be executed by being read from the recording medium by a computer.

In addition, for reference, the effects of the technique according to the present embodiments will be indicated using actual computation results. FIG. 22 is a diagram illustrating an example of effects according to the first embodiment. FIG. 22 illustrates the results of computing the far field of the analysis target model by each of the traditional computation approach and the computation approach according to the present embodiment, with a number of distant observation points of 720 and a number of pieces of time-series data of 530. In FIG. 22, the proposed technique portions indicate the memory capacity, the amount of computation, and the computational time involved in the computation when the far field is computed using the computation approach according to the present embodiment. Compared with the traditional computation approach, when the computation approach according to the present embodiment is used, the involved memory capacity and amount of computation may be reduced by approximately 50%, and the involved computational time may be reduced by 40%. In addition, since the example illustrated in FIG. 22 is a computation results by a relatively small-scale analysis target model, further effects may be expected with a larger-scale model.

Figure 23:
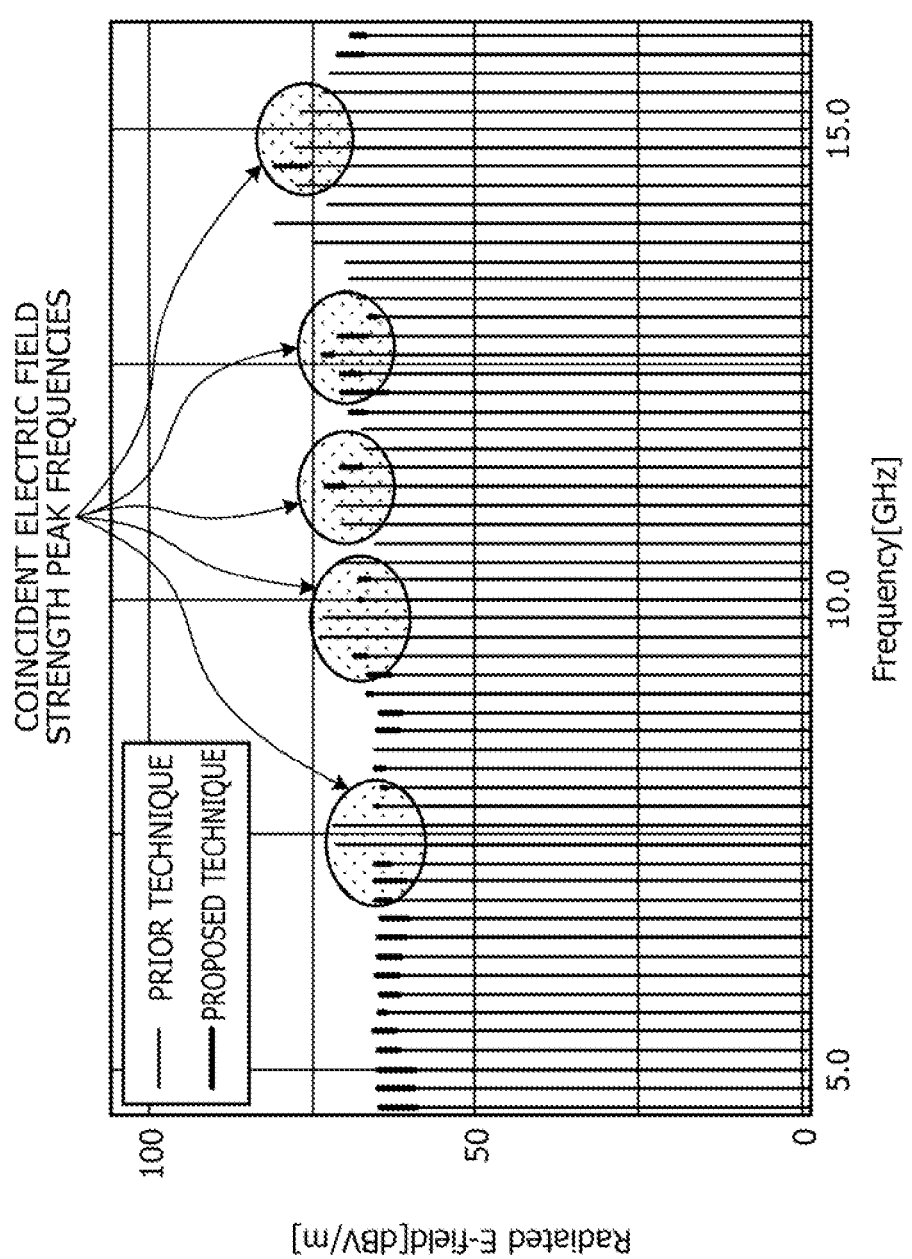
FIG. 23 is a diagram illustrating an example of a far-field computation result according to the first embodiment.

FIG. 23 is a diagram illustrating an example of a far-field computation result according to the first embodiment. FIG. 23 illustrates the frequency characteristics of the electric field strength of the far field when the far field of the analysis target model is computed by each of the traditional computation approach and the computation approach according to the present embodiment. Referring to FIG. 23, it may be confirmed that the traditional computation approach and the computation approach according to the present embodiment have the coincident peak frequencies of the electric field strength and the same trend of frequency characteristics. From the results in FIGS. 22 and 23, using the computation approach according to the present embodiment may reduce the involved memory capacity and time while maintaining the computation accuracy for the far field.

Second Embodiment

Incidentally, while the embodiments have been described above, the embodiments may be carried out in a variety of different modes in addition to the embodiments described above.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer-readable recording medium storing a simulation program for causing a computer to execute a process comprising:
generating thinned grids for electromagnetic current computation, according to electric field strength distribution in an equivalent electromagnetic current area; and
calculating equivalent electromagnetic currents and far fields, by using the thinned grids,
the generating the thinned grids includes:
calculating electric field strength for each of cells generated by dividing each plane of the equivalent electromagnetic current area, which is a rectangular parallelepiped or cubic area; and
generating the thinned grids by merging a predetermined number of the cells, based on the electric field strength.

2. The non-transitory computer-readable recording medium according to claim 1, wherein
the generating the thinned grids by merging the predetermined number of the cells includes
generating the thinned grids by merging all the cells in a thinning target range when the electric field strength of all the cells in the thinning target range that includes the predetermined number of the cells is equal to or less than a predetermined upper limit value.

3. The non-transitory computer-readable recording medium according to claim 1, wherein
the generating the thinned grids by merging the predetermined number of the cells includes
generating the thinned grids by merging all the cells in the thinning target range when the electric field strength of all the cells in the thinning target range that includes the predetermined number of cells is equal to or less than a first upper limit value and a variation coefficient of the electric field strength for all the cells in the thinning target range is equal to or less than a second upper limit value.

4. The non-transitory computer-readable recording medium according to claim 1, wherein
the generating the thinned grids by merging the predetermined number of the cells includes
generating the thinned grids such that a vertical or horizontal size of the thinning target range is equal to or less than a predetermined upper limit value.

5. The non-transitory computer-readable recording medium according to claim 1, wherein
the calculating the equivalent electromagnetic currents includes calculating electromagnetic currents for each of the cells that are not merged for the thinned grids and for each of the thinned grids.

6. The non-transitory computer-readable recording medium according to claim 5, wherein
the calculating the electromagnetic currents for each of the thinned grids includes:
calculating magnetic currents by integrating first calculation results for electric fields that correspond to the cells in the thinned grids, when there is a plurality of the first calculation results; and
calculating electric currents by integrating second calculation results for magnetic fields that correspond to the cells in the thinned grids, when there is a plurality of the second calculation results.

7. The non-transitory computer-readable recording medium according to claim 1, wherein the calculating the far fields includes
calculating the far fields for each of the cells that are not merged for the thinned grids and for each of the thinned grids.

8. A simulation method comprising:
generating thinned grids for electromagnetic current computation, according to electric field strength distribution in an equivalent electromagnetic current area; and
calculating equivalent electromagnetic currents and far fields, by using the thinned grids,
the generating the thinned grids includes:
calculating electric field strength for each of cells generated by dividing each plane of the equivalent electromagnetic current area, which is a rectangular parallelepiped or cubic area; and
generating the thinned grids by merging a predetermined number of the cells, based on the electric field strength.

9. The simulation method according to claim 8, wherein
the generating the thinned grids by merging the predetermined number of the cells includes
generating the thinned grids by merging all the cells in a thinning target range when the electric field strength of all the cells in the thinning target range that includes the predetermined number of the cells is equal to or less than a predetermined upper limit value.

10. The simulation method according to claim 8, wherein
the generating the thinned grids by merging the predetermined number of the cells includes
generating the thinned grids by merging all the cells in the thinning target range when the electric field strength of all the cells in the thinning target range that includes the predetermined number of cells is equal to or less than a first upper limit value and a variation coefficient of the electric field strength for all the cells in the thinning target range is equal to or less than a second upper limit value.

11. The simulation method according to claim 8, wherein
the generating the thinned grids by merging the predetermined number of the cells includes
generating the thinned grids such that a vertical or horizontal size of the thinning target range is equal to or less than a predetermined upper limit value.

12. The simulation method according to claim 8, wherein
the calculating the equivalent electromagnetic currents includes
calculating electromagnetic currents for each of the cells that are not merged for the thinned grids and for each of the thinned grids.

13. The simulation method according to claim 12, wherein the calculating the electromagnetic currents for each of the thinned grids includes:
calculating magnetic currents by integrating first calculation results for electric fields that correspond to the cells in the thinned grids, when there is a plurality of the first calculation results; and
calculating electric currents by integrating second calculation results for magnetic fields that correspond to the cells in the thinned grids, when there is a plurality of the second calculation results.

14. The simulation method according to claim 8, wherein the calculating the far fields includes
calculating the far fields for each of the cells that are not merged for the thinned grids and for each of the thinned grids.

15. A simulation device comprising:
a memory; and
a processor coupled to the memory and configured to:
generate thinned grids for electromagnetic current computation, according to electric field strength distribution in an equivalent electromagnetic current area; and
calculate equivalent electromagnetic currents and far fields, by using the thinned grids,
a processing to generate the thinned grids includes:
calculating electric field strength for each of cells generated by dividing each plane of the equivalent electromagnetic current area, which is a rectangular parallelepiped or cubic area; and
generating the thinned grids by merging a predetermined number of the cells, based on the electric field strength.

16. The simulation device according to claim 15, wherein
a processing to generate the thinned grids by merging the predetermined number of the cells includes
generating the thinned grids by merging all the cells in a thinning target range when the electric field strength of all the cells in the thinning target range that includes the predetermined number of the cells is equal to or less than a predetermined upper limit value.

17. The simulation device according to claim 15, wherein
the generating the thinned grids by merging the predetermined number of the cells includes a processing to generate the thinned grids by merging all the cells in the thinning target range when the electric field strength of all the cells in the thinning target range that includes the predetermined number of cells is equal to or less than a first upper limit value and a variation coefficient of the electric field strength for all the cells in the thinning target range is equal to or less than a second upper limit value.

* * * * *